United States Patent
Voor et al.

(10) Patent No.: US 11,749,893 B2
(45) Date of Patent: Sep. 5, 2023

(54) APPARATUS FOR ANTENNA IMPEDANCE-MATCHING AND ASSOCIATED METHODS

(71) Applicant: Silicon Laboratories Inc., Austin, TX (US)

(72) Inventors: Thomas E. Voor, Cedar Park, TX (US); Attila Zolomy, Budapest (HU); Pasi Rahikkala, Vihti (FI)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/420,111

(22) Filed: May 22, 2019

(65) Prior Publication Data

US 2019/0280384 A1    Sep. 12, 2019

Related U.S. Application Data

(63) Continuation-in-part of application No. 16/237,583, filed on Dec. 31, 2018, which is a continuation-in-part of application No. 15/250,719, filed on Aug. 29, 2016, now Pat. No. 10,374,300, and a continuation-in-part of application No. 16/237,511, filed on Dec. 31, 2018, now abandoned.

(51) Int. Cl.
*H01Q 7/00* (2006.01)
*H03H 7/38* (2006.01)
*H01Q 1/22* (2006.01)

(52) U.S. Cl.
CPC ........... *H01Q 7/005* (2013.01); *H01Q 1/2291* (2013.01); *H03H 7/38* (2013.01)

(58) Field of Classification Search
CPC ........... H01Q 7/00; H01Q 7/005; H01Q 1/50; H01Q 1/2291
See application file for complete search history.

(56) References Cited

U.S. PATENT DOCUMENTS

| | | |
|---|---|---|
| 4,328,501 A | 5/1982 | DeSantis |
| 4,799,066 A | 1/1989 | Deacon |
| 5,631,611 A | 5/1997 | Luu |
| 5,874,926 A | 2/1999 | Tsuru |
| 5,889,445 A | 3/1999 | Ritter |
| 5,949,299 A | 9/1999 | Harada |
| 5,995,814 A | 11/1999 | Yeh |
| 6,009,318 A | 12/1999 | Freed |

(Continued)

FOREIGN PATENT DOCUMENTS

| | | |
|---|---|---|
| CN | 106505962 A | 3/2017 |
| EP | 2214306 | 8/2010 |
| KR | 20150072119 A | 6/2015 |

OTHER PUBLICATIONS

U.S. Appl. No. 16/420,116, filed May 2019, Zolomy.
(Continued)

*Primary Examiner* — Hoang V Nguyen
(74) *Attorney, Agent, or Firm* — Law Offices of Maximilian R. Peterson

(57) ABSTRACT

An apparatus includes a module, which includes an impedance matching circuit. The apparatus further includes a capacitor that is external to the module, and is coupled to the impedance matching circuit. The apparatus further includes a loop antenna to transmit or receive the RF signals. The loop antenna is coupled to the capacitor.

20 Claims, 33 Drawing Sheets

(56) References Cited

U.S. PATENT DOCUMENTS

| | | | |
|---|---|---|---|
| 6,329,886 B1* | 12/2001 | Ogoro | H03H 7/38 333/32 |
| 6,603,430 B1 | 8/2003 | Hill | |
| 6,862,441 B2 | 3/2005 | Ella | |
| 6,980,776 B2 | 12/2005 | Shimada | |
| 6,990,357 B2 | 1/2006 | Ella | |
| 7,034,630 B2 | 4/2006 | Rijks | |
| 7,058,372 B1 | 6/2006 | Pardoen | |
| 7,088,307 B2 | 8/2006 | Imaizumi | |
| 7,116,185 B2 | 10/2006 | Ohi | |
| 7,155,252 B2 | 12/2006 | Martin | |
| 7,193,477 B2 | 3/2007 | Chang et al. | |
| 7,199,684 B2 | 4/2007 | Aigner | |
| 7,248,844 B2 | 7/2007 | Rofougaran | |
| 7,323,939 B2 | 1/2008 | Han et al. | |
| 7,330,085 B2 | 2/2008 | Ezzeddine | |
| 7,466,277 B2 | 12/2008 | Ishizuka | |
| 7,489,914 B2 | 2/2009 | Govind | |
| 7,518,469 B2 | 4/2009 | Kemmochi | |
| 7,557,757 B2 | 7/2009 | Deavours | |
| 7,586,388 B2 | 9/2009 | Harada | |
| 7,683,733 B2 | 3/2010 | Li | |
| 7,755,435 B2 | 7/2010 | Lu et al. | |
| 7,978,024 B2 | 7/2011 | Cheng | |
| 8,068,795 B2 | 11/2011 | Bavisi | |
| 8,081,047 B2 | 12/2011 | Royak | |
| 8,138,853 B2 | 3/2012 | Chu | |
| 8,164,387 B1 | 4/2012 | Apel | |
| 8,174,390 B2 | 5/2012 | Kim | |
| 8,229,367 B2 | 7/2012 | Chan et al. | |
| 8,306,489 B2 | 11/2012 | Schwarzmueller | |
| 8,344,952 B2 | 1/2013 | Yi | |
| 8,368,481 B2 | 2/2013 | Jin | |
| 8,436,695 B2 | 5/2013 | Mu | |
| 8,493,126 B2 | 7/2013 | Sankaranarayanan | |
| 8,633,781 B2 | 1/2014 | Bradley | |
| 8,842,410 B2 | 9/2014 | Chan | |
| 9,059,681 B2 | 6/2015 | Tanaka | |
| 9,083,301 B2 | 7/2015 | Tanaka | |
| 9,106,204 B2 | 8/2015 | Fritz | |
| 9,306,535 B2 | 4/2016 | Bradley | |
| 9,316,723 B2 | 4/2016 | Tayrani | |
| 9,397,720 B2 | 7/2016 | Jerng | |
| 9,520,854 B2 | 12/2016 | Kim | |
| 9,647,706 B2 | 5/2017 | Salfelner | |
| 9,680,442 B2 | 6/2017 | Salfelner | |
| 9,917,566 B2* | 3/2018 | Salfelner | H01Q 7/00 |
| 9,939,471 B1 | 4/2018 | Omoumi | |
| 9,991,597 B2* | 6/2018 | Velandia Torres | H01Q 7/005 |
| 10,071,605 B1 | 9/2018 | Liang | |
| 10,305,532 B1 | 5/2019 | Jantzi | |
| 10,374,300 B2 | 8/2019 | Rahikkala | |
| 2002/0118075 A1 | 8/2002 | Ohwada | |
| 2003/0012808 A1 | 7/2003 | Ella | |
| 2003/0174093 A1 | 9/2003 | Huber | |
| 2003/0210189 A1 | 11/2003 | Jinushi | |
| 2005/0003771 A1 | 1/2005 | De Ruijter | |
| 2005/0174297 A1 | 8/2005 | Cake | |
| 2005/0208917 A1 | 9/2005 | Roufoogaran | |
| 2006/0044080 A1 | 3/2006 | Hagiwara | |
| 2006/0092079 A1 | 5/2006 | de Rochemont | |
| 2006/0103578 A1 | 5/2006 | Landaeus | |
| 2007/0001704 A1 | 1/2007 | O'Mahony | |
| 2007/0024377 A1 | 2/2007 | Wang et al. | |
| 2007/0268092 A1 | 11/2007 | Inoue | |
| 2008/0129610 A1 | 6/2008 | Tsafati et al. | |
| 2008/0174383 A1 | 7/2008 | Zolomy et al. | |
| 2008/0186106 A1 | 8/2008 | Christian | |
| 2008/0278258 A1 | 11/2008 | Liu | |
| 2009/0015500 A1 | 1/2009 | Hoshiai | |
| 2009/0085689 A1 | 4/2009 | Rohani | |
| 2009/0121959 A1 | 5/2009 | Li | |
| 2009/0130999 A1 | 5/2009 | Chen | |
| 2009/0174618 A1 | 7/2009 | Huang | |
| 2009/0251382 A1 | 10/2009 | Umehara | |
| 2009/0315792 A1 | 12/2009 | Miyashita | |
| 2009/0322617 A1 | 12/2009 | Tseng | |
| 2010/0073248 A1 | 3/2010 | Motta | |
| 2010/0109846 A1 | 5/2010 | Nagai | |
| 2010/0231451 A1 | 9/2010 | Noguchi | |
| 2010/0238079 A1 | 9/2010 | Ayatollahi | |
| 2010/0253581 A1 | 10/2010 | Tsou | |
| 2010/0265145 A1 | 10/2010 | Chung | |
| 2010/0289700 A1 | 11/2010 | Yang | |
| 2011/0223873 A1 | 9/2011 | Qiu | |
| 2011/0256841 A1 | 10/2011 | Kakuya | |
| 2012/0001821 A1 | 1/2012 | Nakano | |
| 2012/0112972 A1 | 5/2012 | Ogawa | |
| 2012/0154071 A1 | 6/2012 | Bradley | |
| 2012/0229360 A1 | 9/2012 | Jagielski | |
| 2012/0314734 A1 | 12/2012 | Zierdt | |
| 2013/0033410 A1 | 2/2013 | Wong | |
| 2013/0214812 A1 | 8/2013 | Koo | |
| 2013/0307742 A1 | 11/2013 | Hu | |
| 2013/0314288 A1 | 11/2013 | Tayrani | |
| 2013/0334215 A1 | 12/2013 | Chen | |
| 2013/0341411 A1 | 12/2013 | Kai | |
| 2013/0342421 A1 | 12/2013 | Katz | |
| 2014/0111381 A1 | 4/2014 | Lee | |
| 2014/0111382 A1 | 4/2014 | Lee et al. | |
| 2014/0113679 A1 | 4/2014 | Wehrmann | |
| 2014/0125540 A1* | 5/2014 | Tetsuno | H01Q 1/50 343/822 |
| 2014/0125548 A1 | 5/2014 | Jouanlanne | |
| 2014/0125552 A1 | 5/2014 | Takisawa | |
| 2014/0320351 A1 | 10/2014 | Wei | |
| 2014/0327494 A1 | 11/2014 | Sato | |
| 2014/0375507 A1 | 12/2014 | Lin | |
| 2014/0375527 A1 | 12/2014 | Rutfors | |
| 2015/0022402 A1 | 1/2015 | Gavilan | |
| 2015/0048896 A1 | 2/2015 | Kovac | |
| 2015/0311881 A1* | 10/2015 | Nagumo | H01Q 9/42 343/861 |
| 2015/0349726 A1 | 12/2015 | Han et al. | |
| 2016/0156335 A1 | 6/2016 | Takeuchi | |
| 2016/0164474 A1 | 6/2016 | Beltran | |
| 2016/0268992 A1 | 9/2016 | Salfelner | |
| 2016/0336649 A1* | 11/2016 | Yu | H01Q 1/48 |
| 2017/0054214 A1 | 2/2017 | Sanders | |
| 2017/0214378 A1 | 7/2017 | Black | |
| 2017/0244442 A1 | 8/2017 | Mizokami | |
| 2018/0062254 A1 | 3/2018 | Rahikkala | |
| 2018/0123221 A1 | 5/2018 | Finn | |
| 2018/0145410 A1 | 5/2018 | Ban | |
| 2018/0316082 A1 | 11/2018 | Keller | |
| 2019/0190149 A1 | 6/2019 | Vida | |
| 2019/0280383 A1 | 9/2019 | Zolomy | |
| 2020/0127628 A1 | 4/2020 | Zolomy | |

OTHER PUBLICATIONS

U.S. Appl. No. 15/250,719, filed Aug. 2016, Rahikkala.
U.S. Appl. No. 16/439,458, filed Jun. 2019, Rahikkala.
U.S. Appl. No. 15/823,319, filed Nov. 2017, Zólomy.
U.S. Appl. No. 15/845,327, filed Dec. 2017, Vida.
U.S. Appl. No. 15/845,369, filed Dec. 2017, Vida.
U.S. Appl. No. 16/237,511, filed Dec. 2018, Zölomy.
U.S. Appl. No. 16/237,583, filed Dec. 2018, Zólomy.
U.S. Appl. No. 16/420,116, filed Feb. 2019, Zólomy.
U.S. Appl. No. 16/719,925, filed Dec. 2019, Vida.
U.S. Appl. No. 16/724,160, filed Dec. 2019, Zólomy.
U.S. Appl. No. 17/491,195, filed Sep. 2021, Hänninen.
U.S. Appl. No. 17/491,221, filed Sep. 2021, Rahikkala.
Johanson Technology, *High Frequency Ceramic Solutions*, 4 pgs., 2016.
Johanson Technology, *High Frequency Ceramic Solutions*, 4 pgs., 2014.
AN91445, *Antenna Design and RF Layout Guidelines*, Cypress, 60 pgs., 2014-2016.
Amotech Co., Ltd., *Datasheet*, 8 pgs., 2009.
Office communication in U.S. Appl. No. 15/250,719, 9 pgs.

(56) References Cited

OTHER PUBLICATIONS

Office communication in U.S. Appl. No. 15/250,719, 8 pgs.
Office communication in U.S. Appl. No. 15/823,319, 18 pgs.
Office communication in U.S. Appl. No. 15/823,319, 29 pgs.
Office communication in U.S. Appl. No. 15/823,319, 32 pgs.
Office communication in U.S. Appl. No. 15/823,319, 16 pgs.
AN923: EFR32 sub-GHz Matching Guide, Silicon Labs, Jun. 29, 2016, 25 pgs.
D.C. Youla, A New Theory of Broad-band Matching, IEE Transactions on Circuit Theory, Mar. 1964, 21 pgs.
Károly Géher: Linear Networks, 4th edition 1979, Hungarian Technical Book Press (pp. 434-436; translated portions included).
AN643: Si446x/Si4362 RX LNA Matching, Silicon Labs, 2014, 26 pgs.
Office communication in U.S. Appl. No. 15/845,327, 12 pgs.
Office communication in U.S. Appl. No. 15/845,327, 18 pgs.
Office communication in U.S. Appl. No. 15/845,327, 15 pgs.
Office communication in U.S. Appl. No. 15/845,327, 14 pgs.
Web page, "3.1 Multi-band Sub-1GHz tunable RF sub-system for smart meters" (Apr. 27, 2017, 2 pgs.), available at https://training.ti.com/multi-band-sub-1ghz-tunable-rf-sub-system-smart-meters.
Office communication in U.S. Appl. No. 16/237,511, 10 pgs.
Office communication in U.S. Appl. No. 16/237,511, 14 pgs.
Office communication in U.S. Appl. No. 16/237,583, 10 pgs.
Office communication in U.S. Appl. No. 16/237,583, 8 pgs.
Office communication in U.S. Appl. No. 16/237,583, 9 pgs.
Office communication in U.S. Appl. No. 16/420,116, 9 pgs.
Office communication in U.S. Appl. No. 16/420,116, 7 pgs.
Office communication in U.S. Appl. No. 16/719,925, 13 pgs.
Office communication in U.S. Appl. No. 16/719,925, 19 pgs.
Office communication in U.S. Appl. No. 16/719,925, 17 pgs.
Office communication in U.S. Appl. No. 16/724,160, 8 pgs.
AN427: EZ Radio Pro™ Si433X & Si443X RX LNA Matching, Silicon Labs, 2009, 22 pgs.
Liu et al., Excitation Techniques of Loop Current Mode of Ground Antenna, 2011 Cross Strait Quad Regional Radio Science and Wireless Technology Conference, 2011, 4 pgs.
Zahid et al., Analysis of a loop type ground radiation antenna based on equivalent circuit model, IET Microwave, Antennas & Propagation Journal, 2016, 6 pgs.
Cho et al., Loop-type ground antenna using capacitor, Electronics Letters, Jan. 6, 2011, vol. 47, No. 1, 1 pg.
Zhang et al., Bandwidth enhancement of ground antenna using resonant feeding circuit, Electronics Letters, Mar. 28, 2013, vol. 49, No. 7, 2 pgs.
Qu et al., Circular Polarized Ground Radiation Antenna for Mobile Applications, IEEE Transactions on Antennas and Propagation, vol. 66, No. 5, May 2018, pp. 2655-2660.
Zahid et al., Decoupler Deign for MIMO Antennas of USB Dongle Applications Using Ground Mode Coupling Analysis, Progress in Electromagnetics Research M, vol. 76, 113-122, 2018, 10 pgs.
Liu et al., Loop-Type Ground Radiation Antenna for Dual-Band WLAN Applications, IEEE Transactions on Antennas and Propagation, vol. 61, No. 9, Sep. 2013, pp. 4819-4823.
Qu et al., Compact dual-band antenna using inverted-L loop and inner rectangular loop for WLAN applications, Electronics Letters, Nov. 5, 2015, vol. 51, No. 23, pp. 1843-1844.
Liu et al., Excitation Techniques of Loop Current Mode of Ground Antenna, 2011 Cross Strait Quad-Regional Radio Science and Wireless Technology Conference, 2011, pp. 1732-1735.
Qu et al., Performance enhancement of ground radiation antenna for Z-wave applications using tunable metal loads, Electronics Letters, Oct. 27, 2016, vol. 52, No. 22, pp. 1827-1828.
Shin et al., Ground Radiation Antenna using Magnetic Coupling Structure, IEEE (date unknown, but before filing of the instant application), 3 pgs.
Qu et al., Ground Radiation Antenna for Mobile Devices, IEEE, 2017, 3 pgs.
Xu et al., Improvement of ground radiation antenna performance using compact EBG in presence of battery effects, Electronics Letters, Jun. 28, 2018, vol. 54, No. 13, pp. 789-800.
Qu et al., Decoupling between ground radiation antennas with ground-coupled loop-type isolator for WLAN applications, IET Microwaves, Antennas & Propagation, 2018, pp. 546-552.
Liu et al., Loop-type ground antenna using resonated loop feeding, intended for mobile devices, Electronics Letters, Mar. 31, 2011, vol. 47, No. 7, 2 pgs.
Piao et al., MIMO Ground-Radiation Antennas Using a Novel Closed-Decoupling-Loop for 5G Applications, IEEE 2020, pp. 142714-142724.
Kim et al., Miniaturized dual-band loop-type ground radiation antenna with enhanced bandwidth for mobile devices, Microw Opt Technol Lett., 2019, pp. 239-243.
Zahid et al., Performance evaluation of loop-type ground radiation antenna based on its optimum impedance level, Electronics Letters, Mar. 30, 2017, vol. 53, No. 7, pp. 446-448.
Hassan et al., A wideband loop-type ground radiation antenna using ground mode tuning and optimum impedance level, Microw Opt Technol Lett., 2019, pp. 1-6.
Johanson Technology, *High Frequency Ceramic Solutions*, 5 pgs., Oct. 12, 2020.
Office communication in U.S. Appl. No. 15/845,369, 17 pgs.
Office communication in U.S. Appl. No. 15/845,369, 15 pgs.
Office communication in U.S. Appl. No. 15/845,369, 12 pgs.
Office communication in U.S. Appl. No. 16/237,511, 15 pgs.
Office communication in U.S. Appl. No. 16/719,925, 15 pgs.
Office communication in U.S. Appl. No. 16/724,160, 28 pgs.
Search report in CN application 201911132444X, 2 pgs.
Office communication in U.S. Appl. No. 15/845,327, 3 pgs.
Office communication in U.S. Appl. No. 16/237,511, 22 pgs.
Office communication in U.S. Appl. No. 16/719,925, 18 pgs.
Office communication in U.S. Appl. No. 16/719,925, 22 pgs.
Office communication in U.S. Appl. No. 15/845,327, 6 pgs.
Office communication in U.S. Appl. No. 15/845,369, 10 pgs.
Office communication in U.S. Appl. No. 16/237,511, 31 pgs.
Office communication in U.S. Appl. No. 17/705,260, 7 pgs.

* cited by examiner

APPARATUS FOR ANTENNA IMPEDANCE-MATCHING AND ASSOCIATED METHODS

CROSS-REFERENCE TO RELATED APPLICATIONS

This patent application is a continuation-in-part of U.S. patent application Ser. No. 16/237,583, filed on Dec. 31, 2018, titled "Apparatus with Partitioned Radio Frequency Antenna and Matching Network and Associated Methods," which is a continuation-in-part of U.S. patent application Ser. No. 15/250,719, filed on Aug. 29, 2016, titled "Apparatus with Partitioned Radio Frequency Antenna Structure and Associated Methods". Furthermore, the present patent application is a continuation-in-part of U.S. patent application Ser. No. 16/237,511, filed on Dec. 31, 2018, titled "Apparatus for Antenna Impedance-Matching and Associated Methods". The foregoing patent applications are hereby incorporated by reference in their entireties for all purposes.

TECHNICAL FIELD

The disclosure relates generally to radio frequency (RF) signal transmission/reception techniques, circuitry, systems, and associated methods. More particularly, the disclosure relates to RF apparatus with partitioned antenna structures and matching networks to provide improved features, and associated methods.

BACKGROUND

With the increasing proliferation of wireless technology, such as Wi-Fi, Bluetooth, and mobile or wireless Internet of things (IoT) devices, more devices or systems incorporate radio frequency (RF) circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry. A variety of types and circuitry for transmitters and receivers are used. Transmitters send or transmit information via a medium, such as air, using RF signals. Receivers at another point or location receive the RF signals from the medium, and retrieve the information.

To transmit or receive RF signals, typical wireless devices or apparatus use antennas. RF modules are sometimes used that include the transmit/receive circuitry. A typical RF module 5, shown in FIG. 1, includes an RF circuit 6, a resonator 8, and a radiator 9. Typically, resonator 8 and radiator 9 are included in the RF module. In other words, the structures that form resonator 8 and radiator 9 are included within RF module 5.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, includes a module, which includes an impedance matching circuit. The apparatus further includes a capacitor that is external to the module, and is coupled to the impedance matching circuit. The apparatus further includes a loop antenna to transmit or receive the RF signals. The loop antenna is coupled to the capacitor.

According to another exemplary embodiment, an apparatus includes a module, which includes a first portion of an impedance matching circuit, and a substrate coupled to the module. The substrate includes a second portion of the impedance matching circuit. The apparatus further includes a capacitor that is external to the module and is coupled to the second portion of the impedance matching circuit. The apparatus further includes a loop antenna to transmit or receive the RF signals. The loop antenna is coupled to the capacitor.

According to another exemplary embodiment, an apparatus includes a module, which includes an RF circuit to transmit or receive RF signals, and an impedance matching circuit. The apparatus further includes a first capacitor that is external to the module, and is coupled to the impedance matching circuit. The apparatus further includes a second capacitor that is external to the module, and is coupled to a the RF circuit. The apparatus further includes a loop antenna to transmit or receive the RF signals. The loop antenna is coupled to the first capacitor.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

One aspect of the disclosure relates generally to RF apparatus with partitioned antenna structures to provide improved features, and associated methods. As described below, according to this aspect, in RF apparatus according to exemplary embodiments, the antenna structures are partitioned. More specifically, part of the resonator and radiator structures are included in one device (e.g., a module), and the remaining or additional part(s) of the resonator and radiator structures are made or fabricated or included outside the device (e.g., externally to a module).

Figure 1:
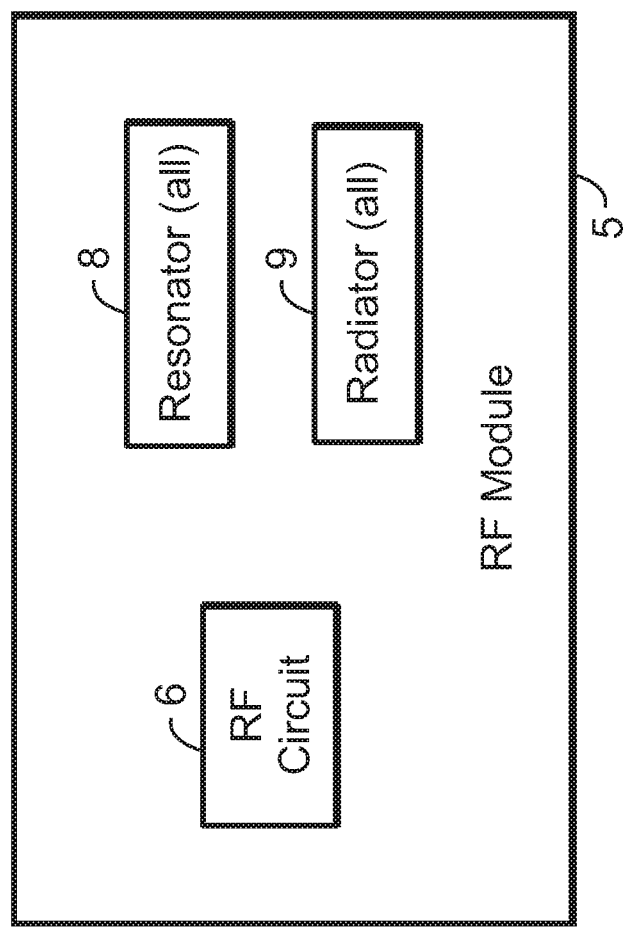
FIG. 1 shows a conventional RF module.
Figure 2:
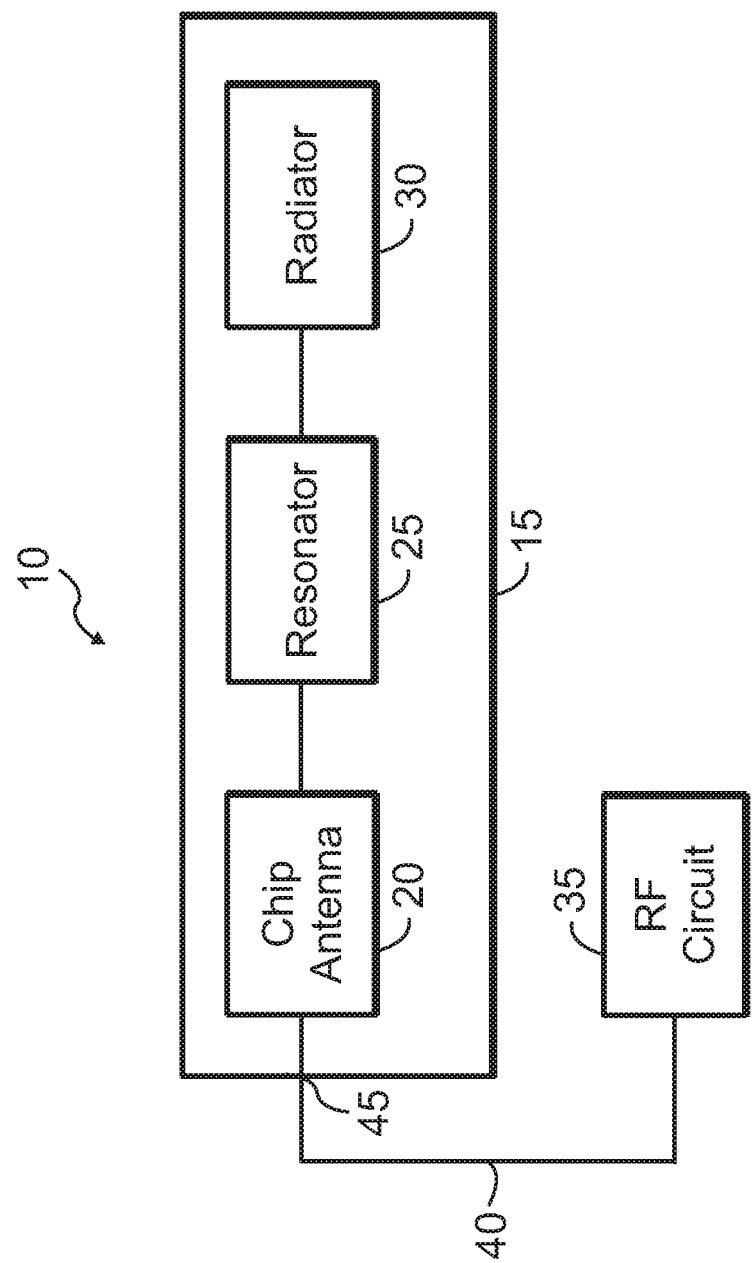
FIG. 2 shows a circuit arrangement for an RF apparatus (or part of an RF apparatus) according to an exemplary embodiment.

FIG. 2 depicts a circuit arrangement 10 for an RF apparatus (or part of an RF apparatus) according to an exemplary embodiment. More specifically, circuit arrangement 10 illustrates the electrical connections or couplings among the various parts of an RF apparatus.

Circuit arrangement 10 includes antenna structure 15. Antenna structure 15 includes chip antenna 20 coupled to resonator 25. Generally, resonator 25 includes devices, components, or apparatus that naturally oscillate at some frequency, e.g., the frequency at which the RF apparatus transmits RF signals or the frequency at which the RF apparatus receives RF signals. In exemplary embodiments, the reactance of one or more features or devices or portion of the substrate (on which various components of circuit arrangement 10 are arranged or fixated) or the substrate layout, matching components (e.g., inductor(s), capacitor(s)) (not shown), and/or chip antenna 20 form resonator 25.

Referring again to FIG. 2, resonator 25 is coupled to radiator 30. Generally, radiator 30 includes devices, components, or apparatus that transforms conducted RF energy (e.g., as received from RF circuit 35 or from a communication medium, such as air or free space) into radiated RF energy. In exemplary embodiments, one or more features or devices or portions of the substrate (on which various components of circuit arrangement 10 are arranged or fixated) or the substrate layout, chip antenna 20, and/or surrounding ground plane (e.g., ground plane formed in or on a substrate on which the substrate include circuit arrangement 10 is arranged or fixated) form radiator 30.

Referring again to FIG. 2, RF circuit 35 couples to antenna structure 15 via link 40. In exemplary embodiments, RF circuit 35 may include transmit (TX), receive (RX), or both transmit and receive (transceiver) circuitry. In the transmit mode, RF circuit 35 uses antenna structure 15 to transmit RF signals. In the receive mode, RF circuit 35 receives RF signals via antenna structure 15. In the transceiver mode, RF circuit 35 can receive RF signals during some periods of time and alternately transmit RF signals during other periods of time (or perform neither transmission nor reception, if desired). Thus, the transceiver mode may be thought of as combining the transmit and receive modes in a time-multiplexed fashion.

Link 40 provides an electrical coupling to provide RF signals from RF circuit 35 to antenna structure 15 or, alternatively, provide RF signals from antenna structure 15 to RF circuit 35 (during the transmit and receive modes, respectively). Generally, link 40 constitutes a transmission line. In exemplary embodiments, link 40 may have or include a variety of forms, devices, or structures. For example, in some embodiments, link 40 may include a coaxial line or structures. As another example, in some embodiments, link 40 may include a stripline or microstrip structure (e.g., two conductors arranged in a length-wise parallel fashion).

Regardless of the form of link 40, link 40 couples to antenna structure 15 at feed point or node 45. In some embodiments, feed point 45 may include a connector, such as an RF connector. In some embodiments, feed point 40 may include electrical couplings (e.g., points, nodes, solder joints, etc.) to couple link 40 to chip antenna 20. Feed point 45 provides RF signals to chip antenna 20 (during the transmit mode) or alternately provides RF signals from chip antenna 20 to link 40 (during the receive mode).

In exemplary embodiments, chip antenna 20 may constitute a variety of desired chip antennas. Chip antennas are passive electronic components with relatively small physical dimensions, as persons of ordinary skill in the art know. Referring to FIG. 2, chip antenna 20, together with resonator 25 and radiator 30, forms antenna structure 15. As noted above, antenna structure 15 transmits RF signals from RF circuit 35 or provides RF signals received from a communication medium (e.g., air) to RF circuit 35. In some embodiments, antennas other than chip antennas may be used. The embodiment shown in FIG. 2 uses chip antenna 20 because of its relatively small size, relatively low cost, and relative ease of availability.

Generally, in exemplary embodiments, structures used to fabricate or implement resonator 25 and radiator 30 might overlap or have common elements. For example, as noted above, in some embodiments, resonator 25 and radiator 30 may include one or more features or devices of the substrate (on which various components of circuit arrangement or RF apparatus are arranged or fixated) or the substrate layout. In such situations, resonator 25 and radiator 30 may be combined.

Figure 3:
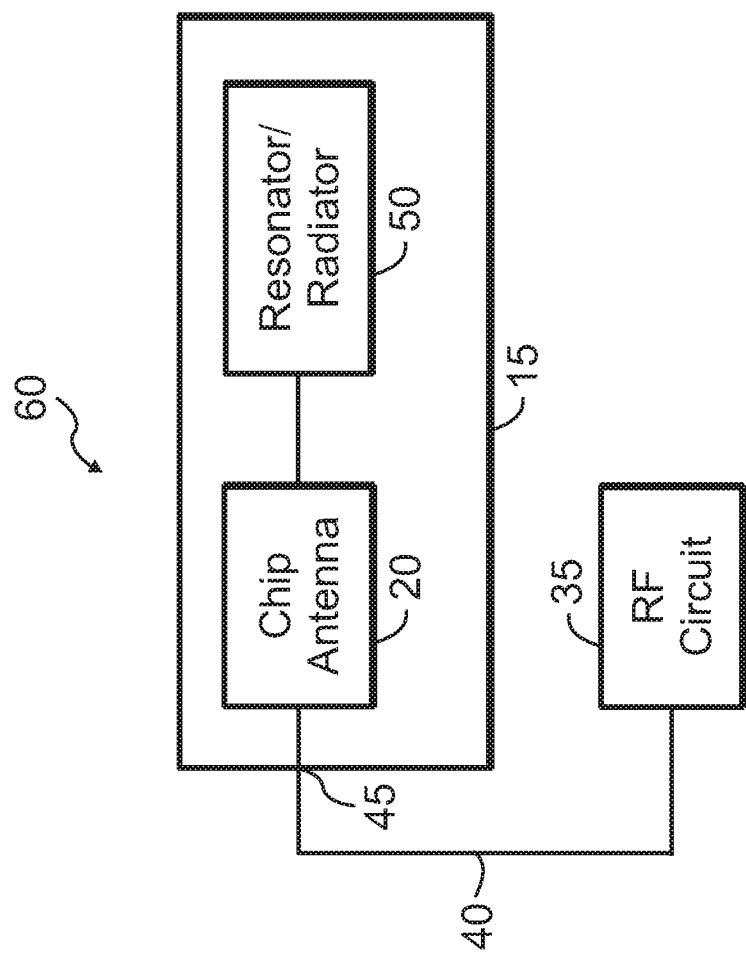
FIG. 3 shows a circuit arrangement for an RF apparatus (or part of an RF apparatus) according to another exemplary embodiment.

FIG. 3 shows a circuit arrangement 60 for an RF apparatus (or part of an RF apparatus) according to an exemplary embodiment that includes a combined resonator and radiator, i.e., resonator/radiator 50. More specifically, circuit arrangement 60 illustrates the electrical connections or couplings among the various parts of an RF apparatus. Other than the combined resonator and radiator, circuit arrangement 60 has the same or similar features as described above with respect to circuit arrangement 10 (see FIG. 2).

Figure 4:
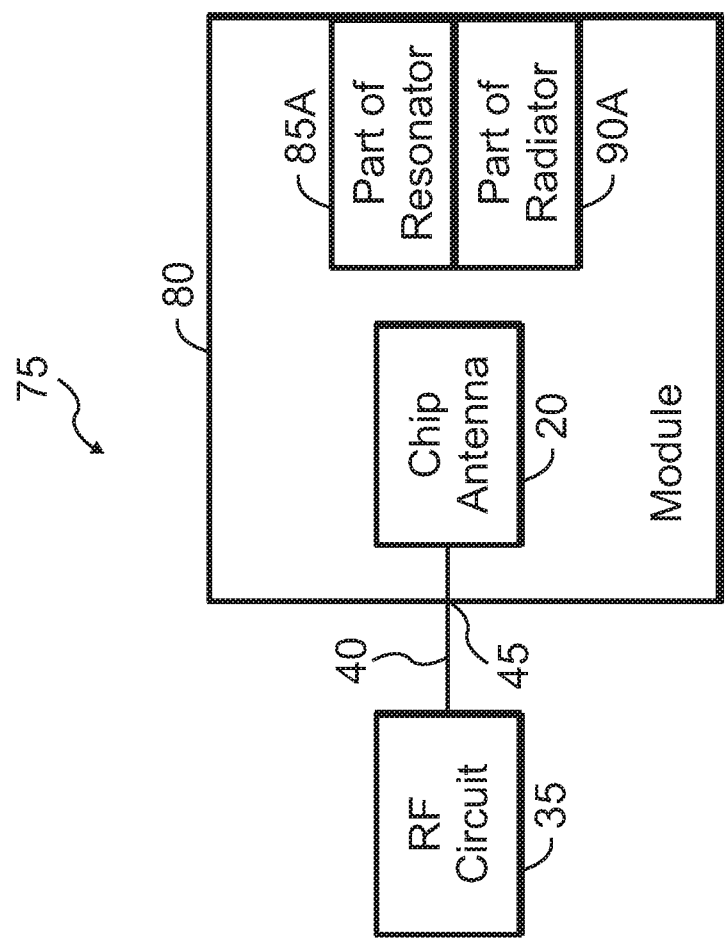
FIG. 4 shows an RF apparatus with a partitioned antenna structure according to an exemplary embodiment.
Figure 5:
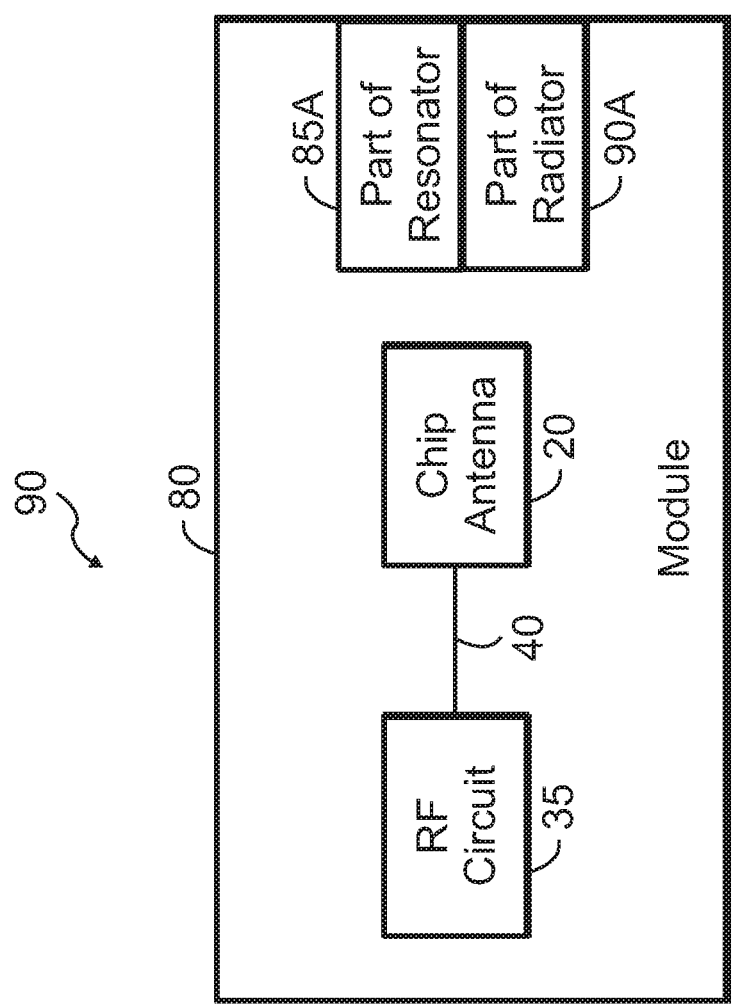
FIG. 5 shows an RF apparatus with a partitioned antenna structure according to another exemplary embodiment.
Figure 6:
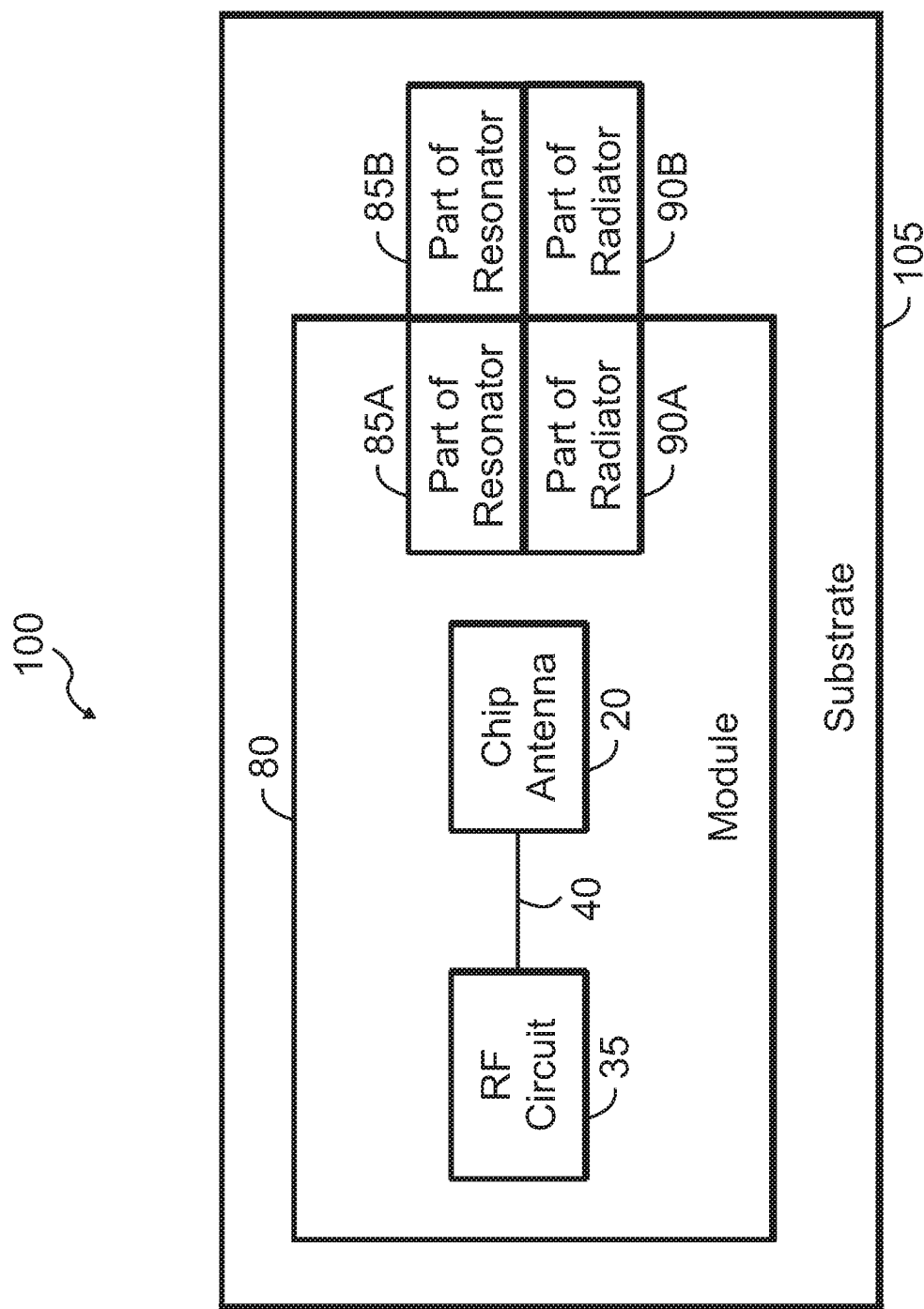
FIG. 6 shows an RF apparatus with a partitioned antenna structure according to another exemplary embodiment.

As noted, FIG. 2 and FIG. 3 show the electrical topology of an RF apparatus according to an exemplary embodiments. FIG. 4, FIG. 5, and FIG. 6 illustrate or add physical features or configuration of RF apparatus according to an exemplary embodiments. More specifically, FIG. 4, FIG. 5, and FIG. 6 show the partitioning of resonator 25 and radiator 30 (similar partitioning may be applied to a combined resonator and radiator, such as resonator/radiator 50 (see FIG. 3).

In exemplary embodiments, a physical carrier, device, enclosure, or other physical entity is used to house or include or support antenna structure 15. In some embodiments, antenna structure 15 (chip antenna 20, resonator 25, and radiator 30 in the embodiment of FIG. 2, or chip antenna 20 and resonator/radiator 50 in the embodiment shown in FIG. 3) are included or housed in a module. FIG. 4 shows such a module, labeled as 80.

In some embodiments, module 80 includes a physical device or component, such as a substrate (not shown) to which various components (e.g., chip antenna 20) are affixed or which supports various components. In exemplary embodiments, the substrate provides physical support for the various components of module 80. In addition, in some embodiments, the substrate provides a mechanism for electrically coupling various components of module 80. For example, the substrate may include electrically conducting traces to couple chip antenna 20 to the resonator and/or radiator.

In exemplary embodiments, the substrate may be fabricated in a variety of ways, as desired. For example, in some embodiments, the substrate may constitute a printed circuit board (PCB). The PCB, as persons of ordinary skill in the art will understand, provides mechanisms or features such as traces, vias, etc., to electrically couple various components of module 80. The PCB mechanisms or features may also be used to implement part of the resonator and/or radiator (or the combined resonator/radiator), for example, traces, matching components, ground planes, etc.

In exemplary embodiments, the material (or materials) used to fabricate the PCB may be selected based on a variety of considerations and attributes. For example, the PCB material may be selected so as to provide certain physical attributes, such as sufficient strength to support the various components in module 80. As another example, the PCB material may be selected so as to provide certain electrical attributes, such as dielectric constant to provide desired electrical characteristics, e.g., reactance at a given or desired frequency.

As noted, exemplary embodiments include a partitioned antenna structure. Referring again to FIG. 4, antenna structure 15 (not labeled in FIG. 4) includes a partitioned resonator and a partitioned radiator. More specifically, antenna structure 15 includes a part of a resonator in module 80. Thus, the resonator is physically partitioned into two portions (or parts or pieces). One of those portions is included in module 80, and is labeled 85A. In other words, portion 85A is less than the entire (or complete) resonator. Resonator part or portion 85A may include a part of the overall resonator structure, for instance, one more matching components, part of an overall ground plane, etc. The second part of the resonator is not included in module 80, and is fabricated using structures external to module 80, as described below in detail. The two portions of the resonator together form the entire or complete resonator.

Similarly, antenna structure 15 (not labeled in FIG. 4) includes a part of a radiator in module 80. In other words, the radiator is physically partitioned into two portions (or parts or pieces). One of those portions is included in module 80, and is labeled 90A in FIG. 4. Thus, portion 90A is less than the entire (or complete) radiator. Radiator part or portion 90A may include a part of the overall radiator structure, for instance, one more matching components, part of an overall ground plane, etc. The second part of the radiator is not included in module 80, and is fabricated using structures external to module 80, as described below in detail. The two portions of the radiator together form the entire or complete radiator.

Note that in some embodiments the resonator or the radiator is partitioned, but not both the resonator or radiator. For example, in some embodiments, the resonator is partitioned as described above, but the radiator is not partitioned and is included in module 80 (even though in this case the radiator may have relatively small efficiency). As another example, in some embodiments, the radiator is partitioned as described above, but the resonator is not partitioned and is included in module 80.

As noted above, in some embodiments, the resonator and the radiator are combined (e.g., a resonator/radiator). In such embodiments, antenna structure 15 (not labeled in FIG. 4) includes a part of the resonator/radiator in module 80. In other words, the resonator/radiator is physically partitioned into two portions (or parts or pieces). One of those portions is included in module 80. The resonator/radiator portion included in module 80 may include a part of the overall resonator/radiator structure, for instance, one more matching components, part of an overall ground plane, etc. The second part of the resonator/radiator is not included in module 80, and is fabricated using structures external to module 80.

Note that in the embodiment shown in FIG. 4, RF circuit 35 is not physically included in module 80. Instead, RF circuit 35 is external to module 80, and is coupled to chip antenna 20 via link 40. In some embodiments, RF circuit 35 is physically included in module 80, as is link 40. FIG. 5 depicts an example of such an embodiment. In the embodiment in FIG. 5, RF circuit is included in module 80, and is coupled to chip antenna 20 via link 40 (which is also included in module 80). Link 40 may be used externally to module 80 to allow communication with RF circuit 35 (e.g., providing signals to be transmitted or receiving RF signals that have been received). Including RF circuit 35 in module 80 facilitates certification of module 80 for a given standards or protocol, as desired.

As noted, antenna structure 15 includes portion of resonator 85A and portion of radiator 90A. The remaining portions or parts of the resonator and radiator are fabricated externally to module 80. In some embodiments, the remaining portions are fabricated using features or devices in a substrate to which module 80 is coupled or affixed. FIG. 6 depicts an example of such an embodiment.

More specifically, apparatus 100 in FIG. 6 shows an RF module 80 that is coupled to or affixed to substrate 105. In addition to module 80, substrate 105 may be coupled to or affixed to other devices, features, subsystems, circuits, etc., as desired. In exemplary embodiments, substrate 105 may be fabricated in a variety of ways, as desired. For example, in some embodiments, the substrate may constitute a PCB (generally labeled as 105). The PCB, as persons of ordinary skill in the art will understand, provides mechanisms or features such as traces, vias, etc., to electrically couple module 80 to other devices, features, subsystems, circuits, etc.

The PCB (or generally substrate) 105 features (or mechanisms or devices or components or parts) may also be used to implement the second portions of the resonator and radiator (or the combined resonator/radiator). Examples of such features include traces, conductive areas or planes, such as ground planes, etc. In the embodiment shown, features of substrate 105 is used to part of the resonator, labeled 85B, and part of the radiator, labeled 90B. Resonator parts or portions 85A and 85B are coupled together (electrically and/or physically) to form the overall resonator (e.g., resonator 25 in FIG. 2). Similarly, radiator parts or portions 90A and 90B are coupled together (electrically and/or physically) to form the overall radiator (e.g., radiator 30 in FIG. 2).

In exemplary embodiments, the material (or materials) used to fabricate substrate or PCB 105 may be selected based on a variety of considerations and attributes. For example, the PCB material may be selected so as to provide certain physical attributes, such as sufficient strength to support the various components coupled or affixed to PCB 105. As another example, the PCB material may be selected so as to provide certain electrical attributes, such as dielectric constant to provide desired electrical characteristics, e.g., reactance at a given or desired frequency, desired overall resonator electrical characteristics, and/or desired overall radiator electrical characteristics.

By partitioning the resonator (e.g., resonator 25) and the radiator (e.g., radiator 30), antenna structure 15 is partitioned. For example, referring to FIG. 6, the resonator is partitioned into portion 85A and portion 85B. In addition, or instead, the radiator is partitioned into portion 90A and portion 90B. Given that antenna structure 15 includes the resonator and the radiator, antenna structure 15 is partitioned as shown in the figure and described above. In embodiments where the resonator and the radiator are combined, partitioning the resulting resonator/radiator also results in antenna structure 15 being partitioned.

Partitioned antenna structures according to exemplary embodiments provide several features and attributes. For example, partitioned antenna structures provide effective tuning of the antenna (e.g., chip antenna 20), rather than merely relying on techniques that involve changing the dielectric materials in relatively close proximity of the antenna, changing packaging materials (e.g., molding materials) or dimensions, or changing the dimensions or characteristics of a substrate (e.g., PCB) to which module 80 is affixed. Consequently, efficient or effective tuning of the antenna for a given application that uses module 80 is possible even if relatively significant detuning occurs because of various factors (e.g., molding and plastic layers, whether used in module 80 or externally to module 80). Thus, tuning of the antenna may be accomplished in a relatively flexible manner and with potentially lower costs (e.g., because of smaller module sizes, etc.).

Moreover, given that module 80 includes portions, rather than the entire, resonator and radiator, the module size is reduced. The reduced size of module 80 provides reduced board area, reduced cost, increased flexibility, etc. For example, resonator portion 85B and radiator 90B, which are fabricated externally to module 80 (e.g., using features or parts of substrate 105) may be sized or configured or fabricated to accommodate a desired RF frequency without changing characteristics of module 80. In other words, resonator portion 85B and radiator portion 90B, which are fabricated externally to module 80 (e.g., using features or parts of substrate 105) may be sized or configured or fabricated to provide effective RF transmission or reception, given the particular characteristics of a module 80.

Figure 7:
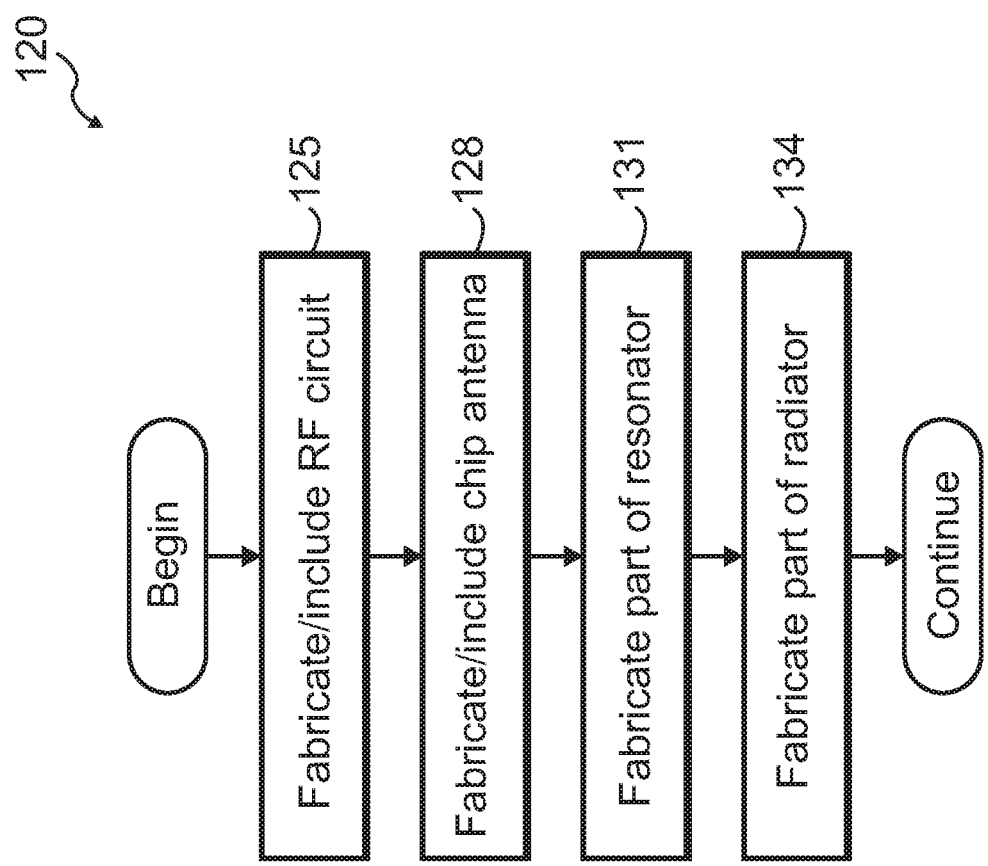
FIG. 7 shows a flow diagram for a process of making a module with a partitioned antenna structure according to an exemplary embodiment.

One aspect of the disclosure pertains to processes for making or using modules such as module 80. FIG. 7 illustrates a flow diagram 120 for a process of making a module with a partitioned antenna structure according to an exemplary embodiment. At 125, the RF circuit (e.g., RF circuit 35, described above) is fabricated and included in the module, as desired. (In embodiments where the RF circuit is already fabricated (e.g., a semiconductor die including the RF circuit), the fabricated RF circuit may be included in module 80. Furthermore, in embodiments where the RF circuit is external to the module, block 125 may be omitted.)

At 128, the chip antenna (e.g., chip antenna 20, described above) is fabricated and included in the module, as desired. (In embodiments where the chip antenna is already fabricated (e.g., as a separate component, obtained in a packaged form), the fabricated chip antenna may be included in module 80.)

At 131, a portion or part of the resonator (e.g., resonator 25 in FIG. 2) is fabricated and included in module 80. The portion or part of the resonator may constitute, for example, portion 85A shown in FIG. 5 and FIG. 6. In other words, the entire structure that forms the resonator is partitioned into two portions, as described above. One of those portions (e.g., portion 85A) is included in module 80.

Alternatively, or in addition, at 134, a portion or part of the radiator (e.g., radiator 30 in FIG. 2) is fabricated and included in module 80. The portion or part of the radiator may constitute, for example, portion 90A shown in FIG. 5 and FIG. 6. (Note that in embodiments that use a combined resonator and radiator, a portion of the resonator/radiator is fabricated and included in module 80). In other words, the entire structure that forms the radiator is partitioned into two portions, as described above. One of those portions (e.g., portion 90A) is included in module 80.

Figure 8:
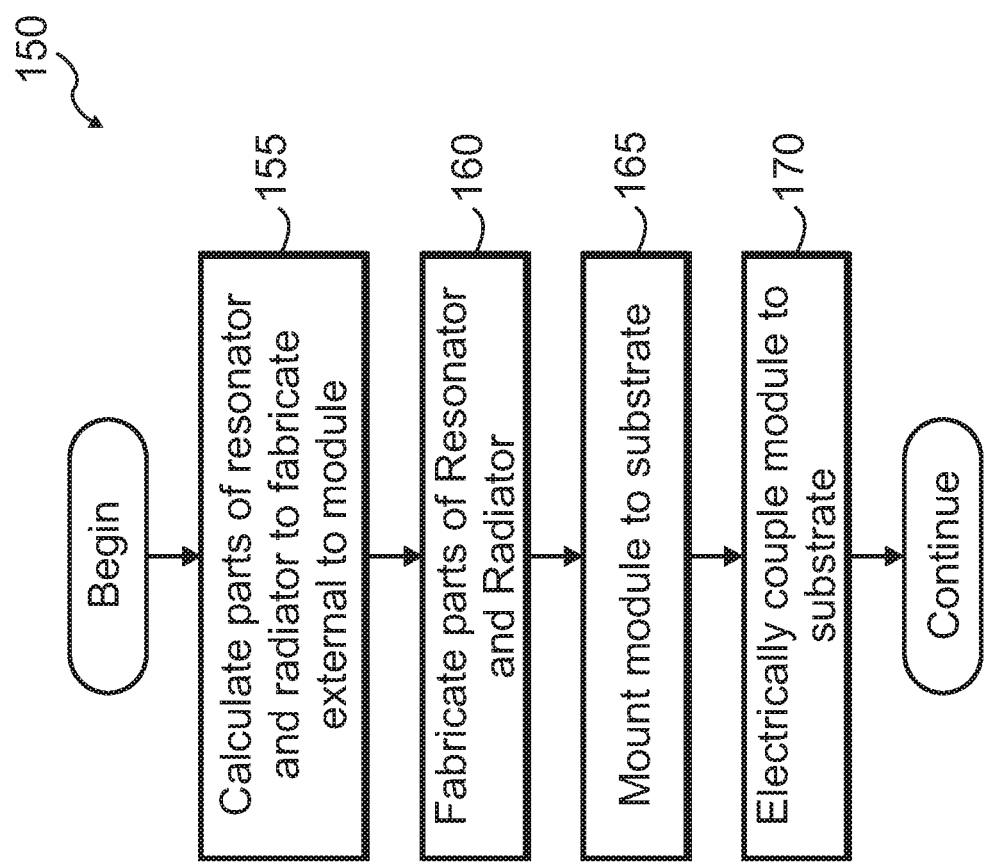
FIG. 8 shows a flow diagram for a process of making an RF apparatus with a partitioned antenna structure according to another exemplary embodiment.

FIG. 8 shows a flow diagram 150 for a process of making an RF apparatus with a partitioned antenna structure according to another exemplary embodiment. The process shown in FIG. 8 assumes that a portion of the resonator and a portion of the radiator (or a portion of the resonator/radiator) are included in a module, such as module 80, as described above (although the process may be used with other embodiments, as desired, by making appropriate modifications).

At 155, characteristics of the portions of the resonator and radiator (e.g., portions 85B and 90B, described above) that are external to the module, e.g., fabricated or included in substrate 105 in FIG. 6, are determined or calculated. Such characteristics include size of various features (e.g., ground plane), material characteristics (e.g., dielectric constants), etc.

At 160, the portions of the resonator and radiator that are external to the module are fabricated using features of a substrate, e.g., substrate 105, described above. At 165, the module is mounted to the substrate. At 170, the module is coupled electrically to the substrate, for example, coupling portion 85A to portion 85B, coupling portion 90A to portion 90B, power and ground connections, RF signal paths, etc. Note that in some embodiments, mounting of the module and electrically coupling the module to the substrate may be performed together (e.g., by soldering the module to the substrate).

Figure 9:
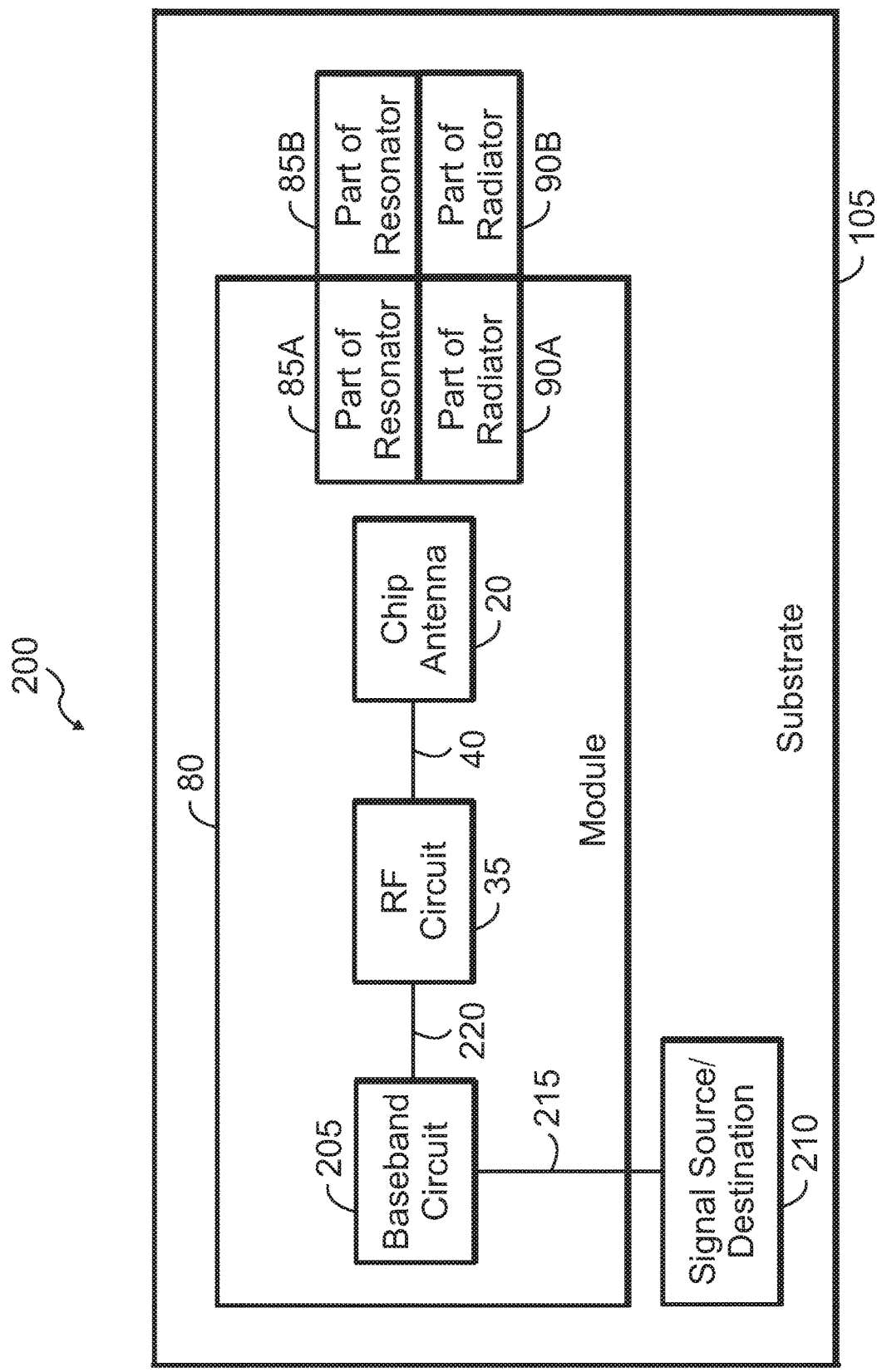
FIG. 9 shows an RF apparatus with a partitioned antenna structure according to another exemplary embodiment.

One aspect of the disclosure relates to including circuitry in an RF apparatus using substrate 105 to provide most or all components for an RF communication apparatus (e.g., receiver, transmitter, transceiver). FIG. 9 illustrates an RF communication apparatus 200 with a partitioned antenna structure according to another exemplary embodiment.

As described above, module 80 and portions 85B and 90B fabricated/included in or on substrate 105 provide RF circuitry for the RF apparatus. In addition, RF communication apparatus 200 includes baseband circuit 205 and signal source/destination 210. In the embodiment shown, baseband circuit 205 is included in module 80. Baseband circuit 205 couples to RF circuit 35 via link 220.

In the case of RF reception, using link 220, baseband circuit may receive signals from RF circuit 35, and convert those signals to baseband signals. The conversion may include frequency translation, decoding, demodulating, etc., as persons of ordinary skill in the art will understand. The signals resulting from the conversion are provided signal source/destination 210 via link 215. In the case of RF reception, signal source/destination 210 may include a signal destination, such as a speaker, a storage device, a control circuit, transducer, etc.

In the case of RF transmission, signal source/destination 210 may include a signal source, such as a transducer, a microphone, sensor, a storage device, a control circuit, etc. The signal source provides signals that are used to modulate RF signals that are transmitted. Baseband circuit 205 receives the output signals of the signal source via link 215, and converts those signals to output signals that it provides to RF circuit 35 via link 220. The conversion may include frequency translation, encoding, modulating, etc., as persons of ordinary skill in the art will understand. RF circuit 35 uses the partitioned antenna structure to communicate RF signals via a medium such as air.

Figure 10:
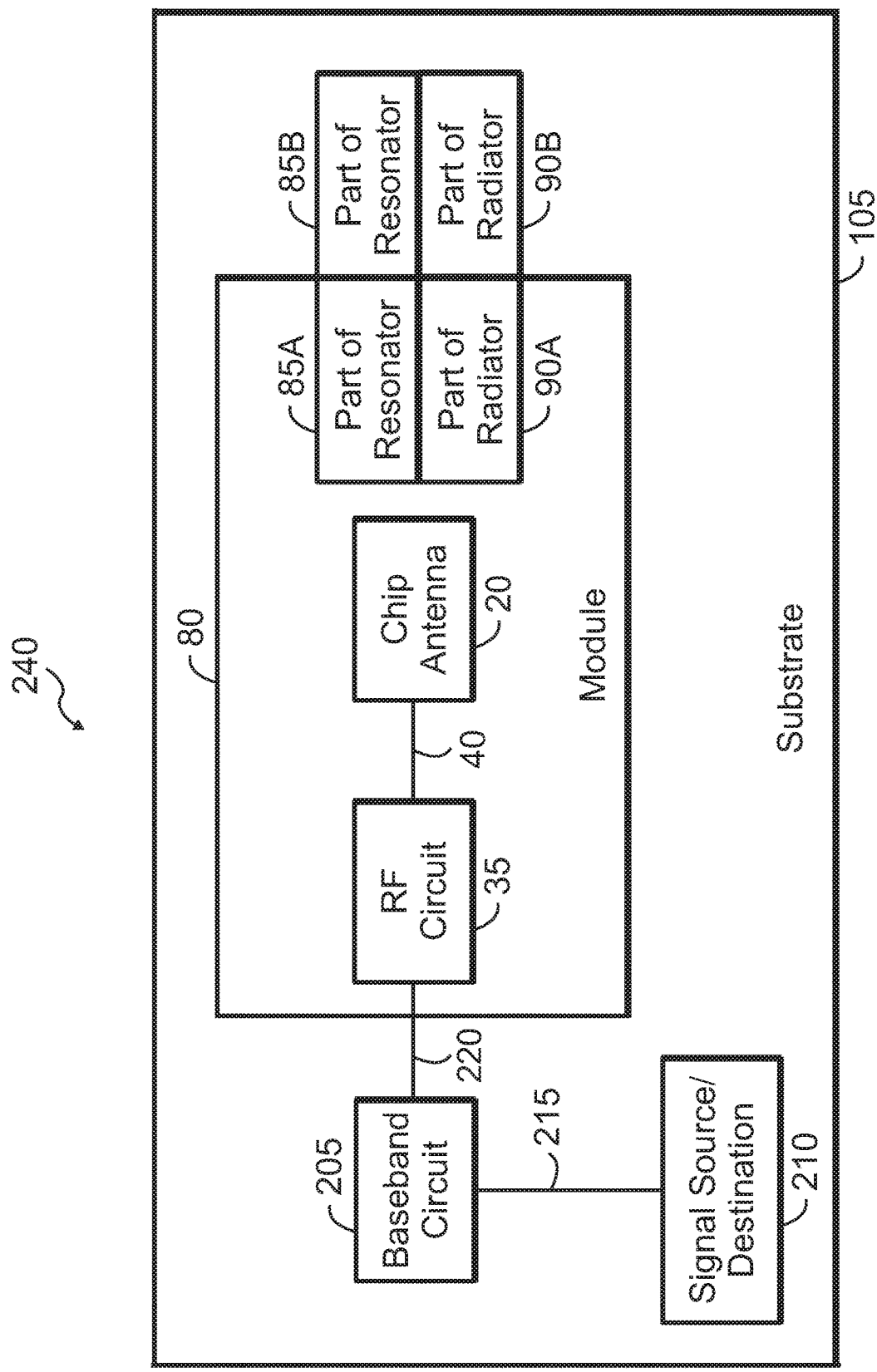
FIG. 10 shows an RF apparatus with a partitioned antenna structure according to another exemplary embodiment.

In some embodiments, baseband circuit 205 may be omitted from module 80, and instead be affixed to substrate 105. For example, a semiconductor die or IC that contains or integrates baseband circuit 205 may be affixed to substrate 205 and may be coupled to module 80. FIG. 10 shows an RF communication apparatus 240 that includes such an arrangement. Link 220 provides a coupling mechanism between baseband circuit 205 and RF circuit 35, as described above. RF communication apparatus 240 provides the functionality described above in connection with FIG. 10. Including baseband circuit 205 in module 80 facilitates certification of module 80 for a given standards or protocol, as desired.

Another aspect of the disclosure relates to apparatus for impedance matching circuits (or matching circuits or matching networks or matching circuitry or impedance matching networks or impedance matching circuitry) in RF apparatus, and associated methods. As persons of ordinary skill in the art will understand, impedance matching circuits may be called simply "matching circuits" without loss of generality.

Impedance matching or impedance transformation circuits, here called matching circuits, are typically used in RF apparatus, such as receivers, transmitters, and/or transceivers, to provide an interface or match between circuitry that have different impedances.

More specifically, in the case of purely resistive impedances, maximum power transfer takes place when the output impedance of a source circuit equals the input impedance of a load circuit. In the case of complex impedances, maximum power transfer takes place when the input impedance of the load circuit is the complex conjugate of the output impedance of the source circuit.

As an example, consider an antenna with a 50-ohm impedance (R=50Ω) coupled to a receive or receiver (RX) circuit with a 50-ohm impedance. In this case, maximum power transfer takes place without the user of an impedance matching circuit because the output impedance of the antenna equals the input impedance of the RX circuit.

Now consider the situation where an antenna with a 50-ohm impedance (R=50Ω) coupled to an RX circuit with a 250-ohm impedance. In this case, because the respective impedances of the antenna and the RX circuit are not equal, maximum power transfer does not take place.

Use of an impedance matching circuit, however, can match the impedance of the antenna to the impedance of the RX circuit. As a result of using the impedance matching circuit, maximum power transfer from the antenna to the RX circuit takes place.

More specifically, the impedance matching circuit is coupled between the antenna and the RX circuit. The impedance matching circuit has two ports, with one port coupled to the antenna, and another port coupled to the RX circuit, respectively.

At the port coupled to the antenna, the impedance matching circuit ideally presents a 50-ohm impedance to the antenna. As a result, maximum power transfer takes place between the antenna and the impedance matching circuit.

Conversely, at the port coupled to the RX circuit, the impedance matching circuit presents a 250-ohm impedance to the RX circuit. Consequently, maximum power transfer takes place between the impedance matching circuit and the RX circuit.

In practice, the impedance matching circuit often fails to perfectly match the impedances. In other words, signal transmission from one network to another is not perfect and 100% of the signal power is not transmitted. As a result, reflection occurs at the interface between circuits or networks with imperfectly matched impedances.

The reflection coefficient, S11, may serve as one measure or figure of merit for the level of impedance matching. A lower S11 denotes better power transmission (better impedance matching), and vice-versa.

In exemplary embodiments, impedance matching circuits or apparatus including impedance matching circuits, and associated methods are disclosed. The impedance matching circuits are relatively low cost, may be used with RF receivers (RX), RF transmitter (TX), and/or RF transceivers.

Furthermore, impedance matching circuits according to various embodiments may be adapted to various operating frequency ranges, power levels, and RX circuit or RX and TX circuit impedances. In addition, impedance matching circuits according to various embodiments may be used with a variety of RX or RX and TX circuit configurations (e.g., low-IF receivers, direct conversion receivers or transmitters, etc.), as persons of ordinary skill in the art will understand.

According to one aspect of the disclosure, matching circuits are provided in RF apparatus that match the impedance of an antenna (more particularly, a loop antenna in some embodiments, as described below in detail) to the impedance of an RF circuit. The matching circuits provide the impedance matching functionality without using chip or ceramic antennas. In other words, according to this aspect of the disclosure, RF apparatus include an RF circuit, a matching circuit, and an antenna.

Instead of using chip antennas, matching circuits are used that use lumped components or elements, such as reactive components (inductor(s), capacitor(s)). In some embodiments, the reactive components constitute surface mount device (SMD) components. Other types of components, however, may be used, depending on various factors, as persons of ordinary skill in the art will understand. Examples of such factors include the frequency of operation, cost, available space, performance specifications, design specifications, available technology, etc., as persons of ordinary skill in the art will understand.

The matching circuits obviate the use of chip antennas in such RF apparatus. Avoiding the use of chip antennas provides some benefits. For example, the overall cost of the RF apparatus may be decreased by avoiding the use of or eliminating the chip antenna.

Figure 11:
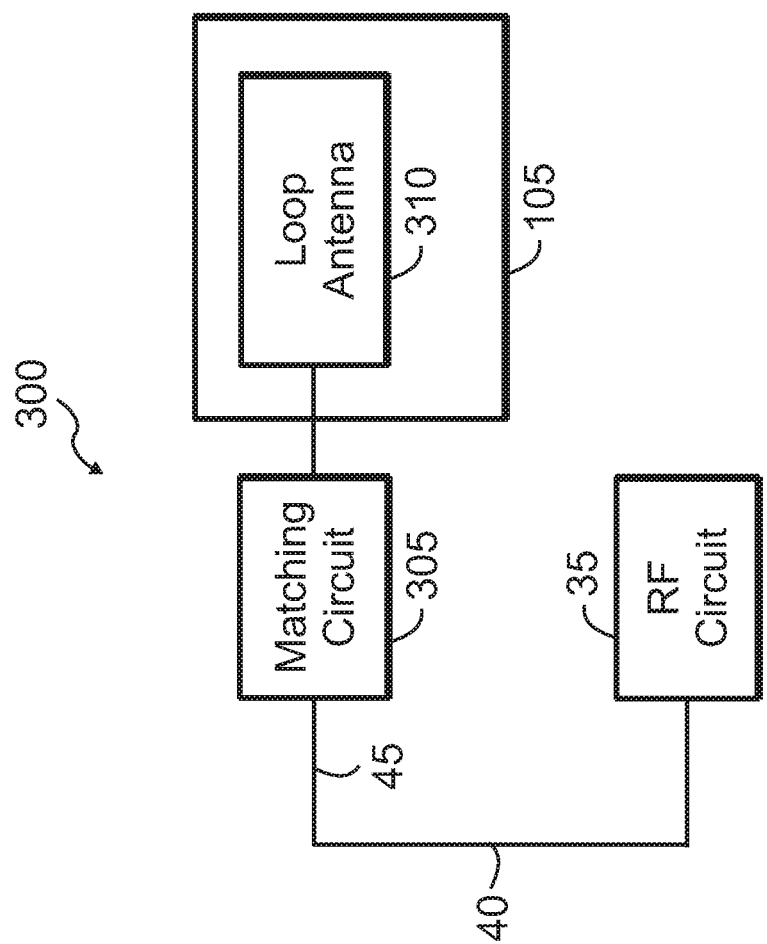
FIG. 11 shows a circuit arrangement for an RF apparatus (or part of an RF apparatus) according to an exemplary embodiment.

FIG. 11 depicts a circuit arrangement for an RF apparatus (or part of an RF apparatus) 300 according to an exemplary embodiment. More specifically, the figure illustrate the electrical connections or couplings among the various parts of RF apparatus 300. RF apparatus 300 includes loop antenna 310 which, as described below in detail, is formed in or on substrate 105. RF circuit 35 couples to matching circuit 305 via link 40. In exemplary embodiments, RF circuit 35 may include transmit (TX), receive (RX), or both transmit and receive (transceiver) circuitry. In the transmit mode, RF circuit 35 uses loop antenna 310 to transmit RF signals. In the receive mode, RF circuit 35 receives RF signals via loop antenna 310. In the transceiver mode, RF circuit 35 can receive RF signals during some periods of time and alternately transmit RF signals during other periods of time (or perform neither transmission nor reception, if desired). Thus, the transceiver mode may be thought of as combining the transmit and receive modes in a time-multiplexed fashion.

Link 40 provides an electrical coupling to provide RF signals from RF circuit 35 to matching circuit 305, alternatively, provide RF signals from antenna matching circuit 305 to RF circuit 35 (during the transmit and receive modes, respectively). Generally, link 40 constitutes a transmission line. In exemplary embodiments, link 40 may have or include a variety of forms, devices, or structures. For example, in some embodiments, link 40 may include a coaxial line or structures. As another example, in some embodiments, link 40 may include a stripline or microstrip structure (e.g., two conductors arranged in a length-wise parallel fashion). Other types of structures may be used to realize link 40, as persons of ordinary skill in the art will understand.

Regardless of the form of link 40, link 40 couples to matching circuit 305 at feed point or node 45. In some embodiments, feed point 45 may include a connector, such as an RF connector. In some embodiments, feed point 40 may include electrical couplings (e.g., points, nodes, solder joints, solder balls, vias, etc.) to couple link 40 to matching circuit 305. Feed point 45 provides RF signals to matching circuit 305 and, ultimately, to loop antenna 310 (during the transmit mode) or, alternately, provides RF signals from loop antenna 310, which are provided to link 40 by matching circuit 305 (during the receive mode).

Figure 12:
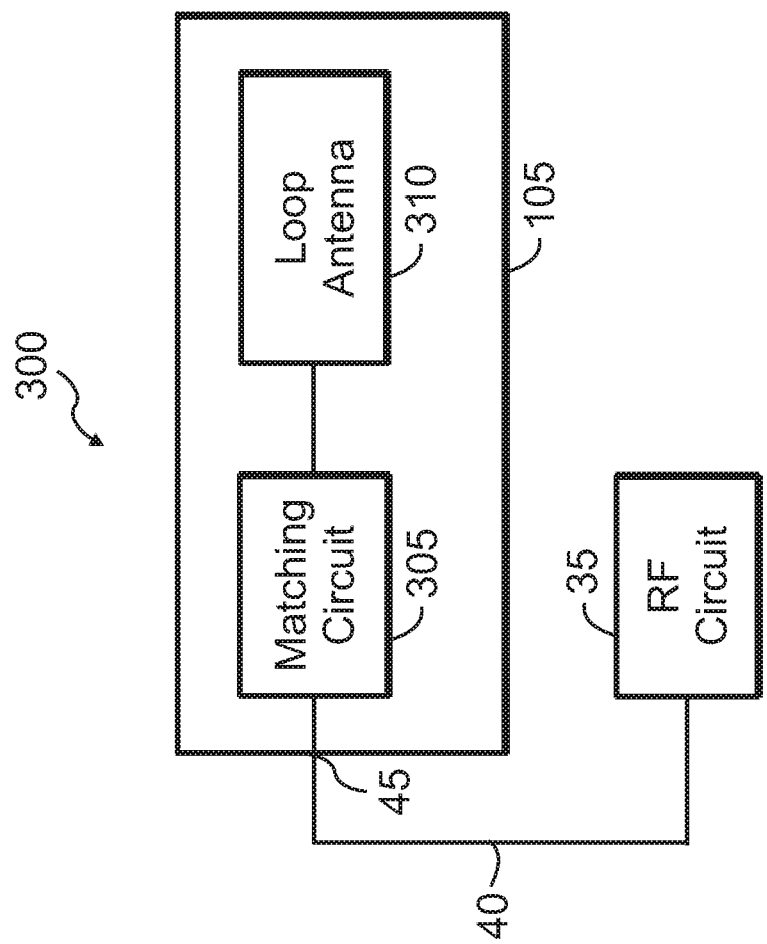
FIG. 12 shows a circuit arrangement for an RF apparatus (or part of an RF apparatus) according to another exemplary embodiment.
Figure 13:
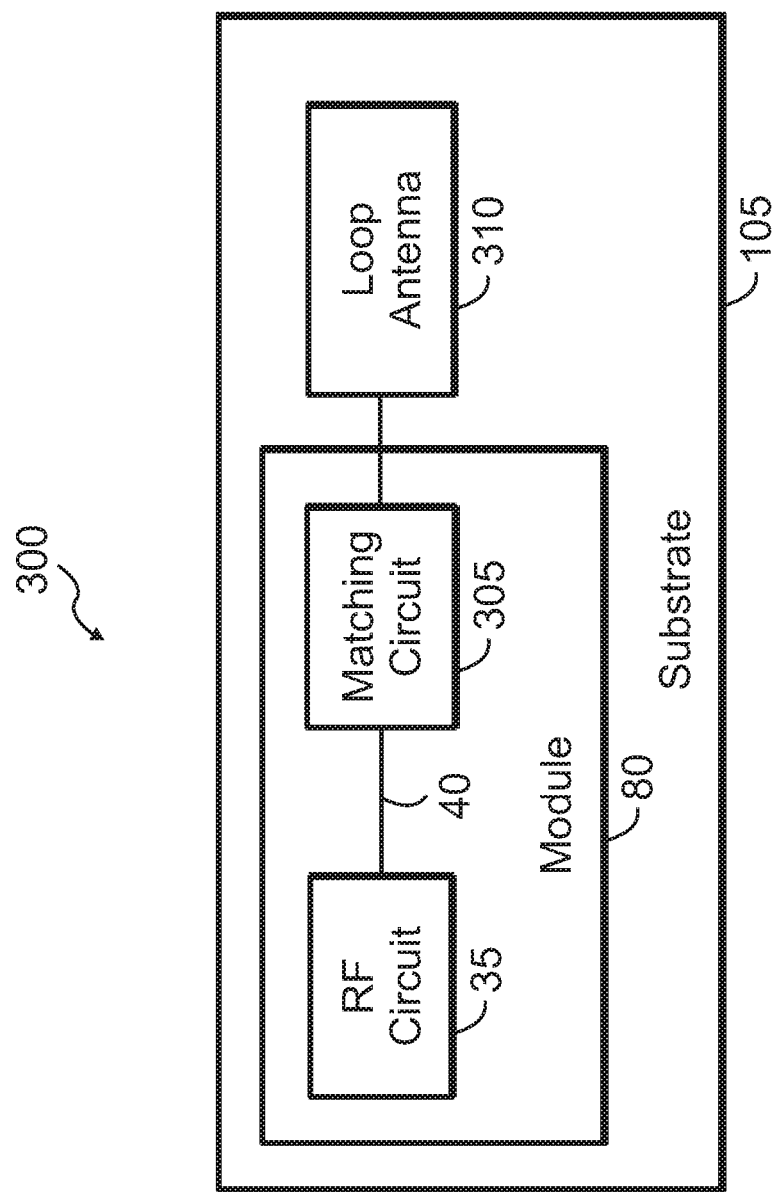
FIG. 13 shows a circuit arrangement for an RF apparatus (or part of an RF apparatus) according to another exemplary embodiment.

In some embodiments, matching circuit 305 may be formed in, on, or using various features of, substrate 105. FIG. 12 shows such an embodiment. In some embodiments, a module, such as an RF module, or semiconductor die, is used. FIG. 13 shows such an embodiment.

Referring to FIG. 13, a variety of alternatives are contemplated and are possible. For example, in some embodiments, module 80 may have its own package. In such embodiments, the package of module 80 is mounted, affixed, or attached to substrate 105, either directly (e.g., soldered), by using a carrier, etc. As another example, in some embodiments, module 80 may be formed or affixed or attached to its own substrate. In such embodiments, the substrate of module 80 is mounted, affixed, or attached to substrate 105, either directly (e.g., soldered), by using a carrier, etc.

Figure 14:
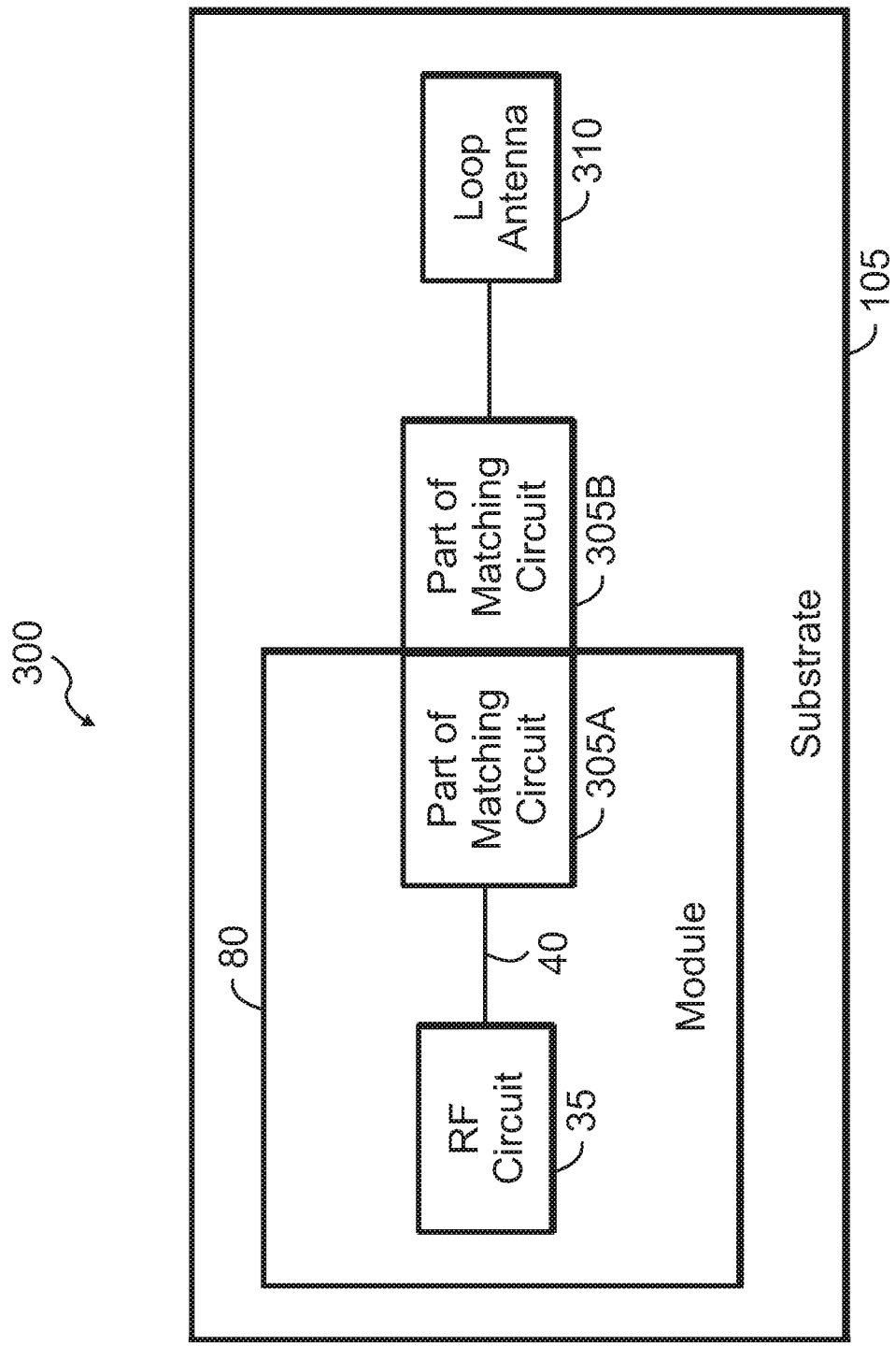
FIG. 14 shows a circuit arrangement for an RF apparatus (or part of an RF apparatus) according to another exemplary embodiment.

In some embodiments, matching circuit 305 is partitioned. In other words, a portion (or part) of the circuitry for matching circuit 305 is included in module 80, whereas another portion of matching circuit 305 is included in or formed in or formed on or formed using substrate 105. FIG. 14 shows such an embodiment. In the embodiment of FIG. 14, a portion 305A of matching circuit 305 is included in module 80. For example, some of the reactive components of matching circuit 305 may be included in module 80. Referring again to FIG. 14, another portion 305B of matching circuit 305 is realized using substrate 105. For example, substrate 105 may include conductive traces or patterns to which some of the reactive components of matching circuit 305 may be affixed (e.g., soldered). The conductive traces or patterns (e.g., patters of conductor formed in a PCB used to realize substrate 105) couple portion 305B of matching circuit 305 to loop antenna 310.

Figure 15:
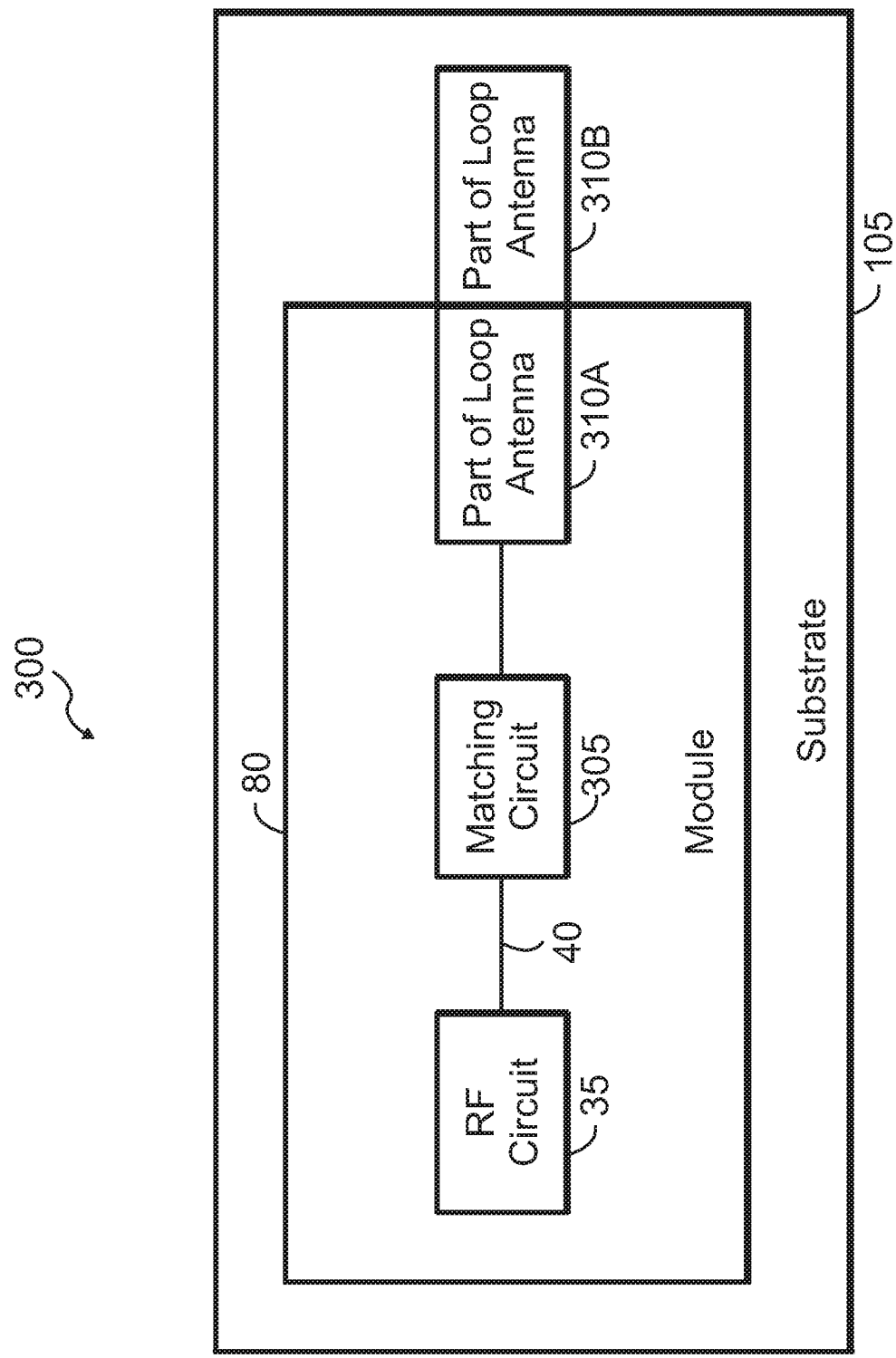
FIG. 15 shows a circuit arrangement for an RF apparatus (or part of an RF apparatus) according to another exemplary embodiment.

In some embodiments, loop antenna 310 is partitioned. In other words, a portion (or part) of loop antenna 310 is included in module 80, whereas another portion of loop antenna 310 is included in or formed in or formed on or formed using substrate 105. FIG. 15 shows such an embodiment. In the embodiment of FIG. 15, a portion 310A of loop antenna 310 is included in module 80. For example, conductor traces or conductors or conductor patterns in module 80 may be used to implement portion 310A of loop antenna 310. Referring again to FIG. 14, another portion 310B of loop antenna 310 is realized using substrate 105. For example, substrate 105 may include conductive traces or patterns used to realize or implement portion 310B of loop antenna 310. The conductive traces or patterns (e.g., patters of conductor formed in a PCB used to realize substrate 105) couple portion 310B of loop antenna 310 to matching circuit 305.

Figure 16:
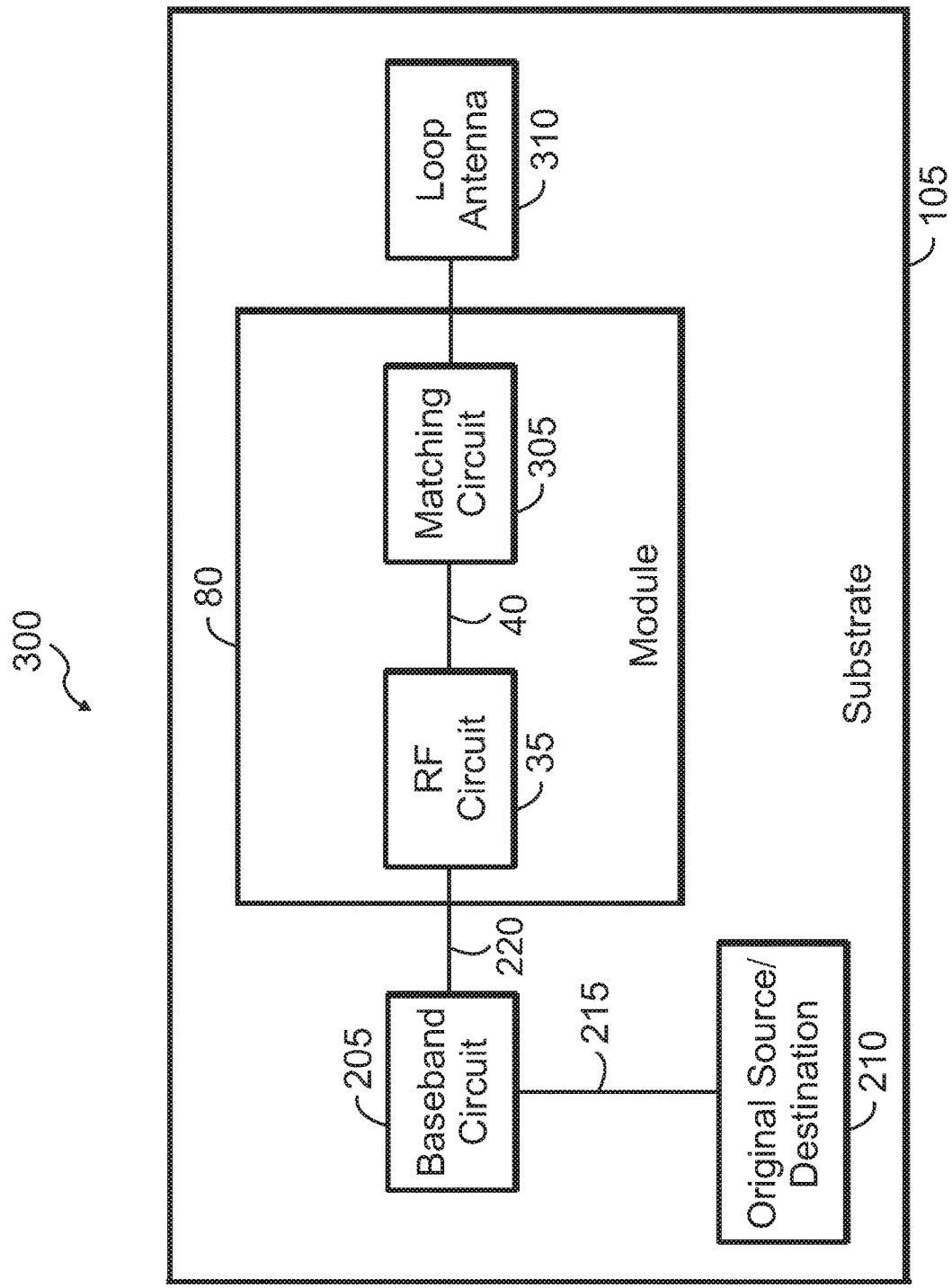
FIG. 16 shows a circuit arrangement for an RF apparatus (or part of an RF apparatus) according to another exemplary embodiment.

One aspect of the disclosure relates to including circuitry in an RF apparatus using substrate 105 to provide some or all components for an RF apparatus (e.g., receiver, transmitter, transceiver) 300. FIG. 16 illustrates an RF communication apparatus 300 with matching circuit 305, included in module 80 (as described above in connection with FIG. 13), according to an exemplary embodiment. Referring to FIG. 16, in addition, RF apparatus 300 includes baseband circuit 205 and signal source/destination 210. In the embodiment shown, baseband circuit 205 is external to module 80, and couples to RF circuit 35 via link 220.

In the case of RF reception, using link 220, baseband circuit may receive signals from RF circuit 35, and convert those signals to baseband signals. The conversion may include frequency translation, decoding, demodulating, etc., as persons of ordinary skill in the art will understand. The signals resulting from the conversion are provided signal source/destination 210 via link 215. In the case of RF reception, signal source/destination 210 may include a signal destination, such as a speaker, a storage device, a control circuit, transducer, etc., as persons of ordinary skill in the art will understand. In the case of RF transmission, signal source/destination 210 may include a signal source, such as a transducer, a microphone, sensor, a storage device, a data source, a control circuit, etc. The signal source provides signals that are used to modulate RF signals that are transmitted. Baseband circuit 205 receives the output signals of the signal source via link 215, and converts those signals to output signals that it provides to RF circuit 35 via link 220. The conversion may include frequency translation, encoding, modulating, etc., as persons of ordinary skill in the art will understand. RF circuit 35 uses matching circuit 305 to provide the RF signals to loop antenna 310 for transmission via a medium, such as air or vacuum.

Figure 17:
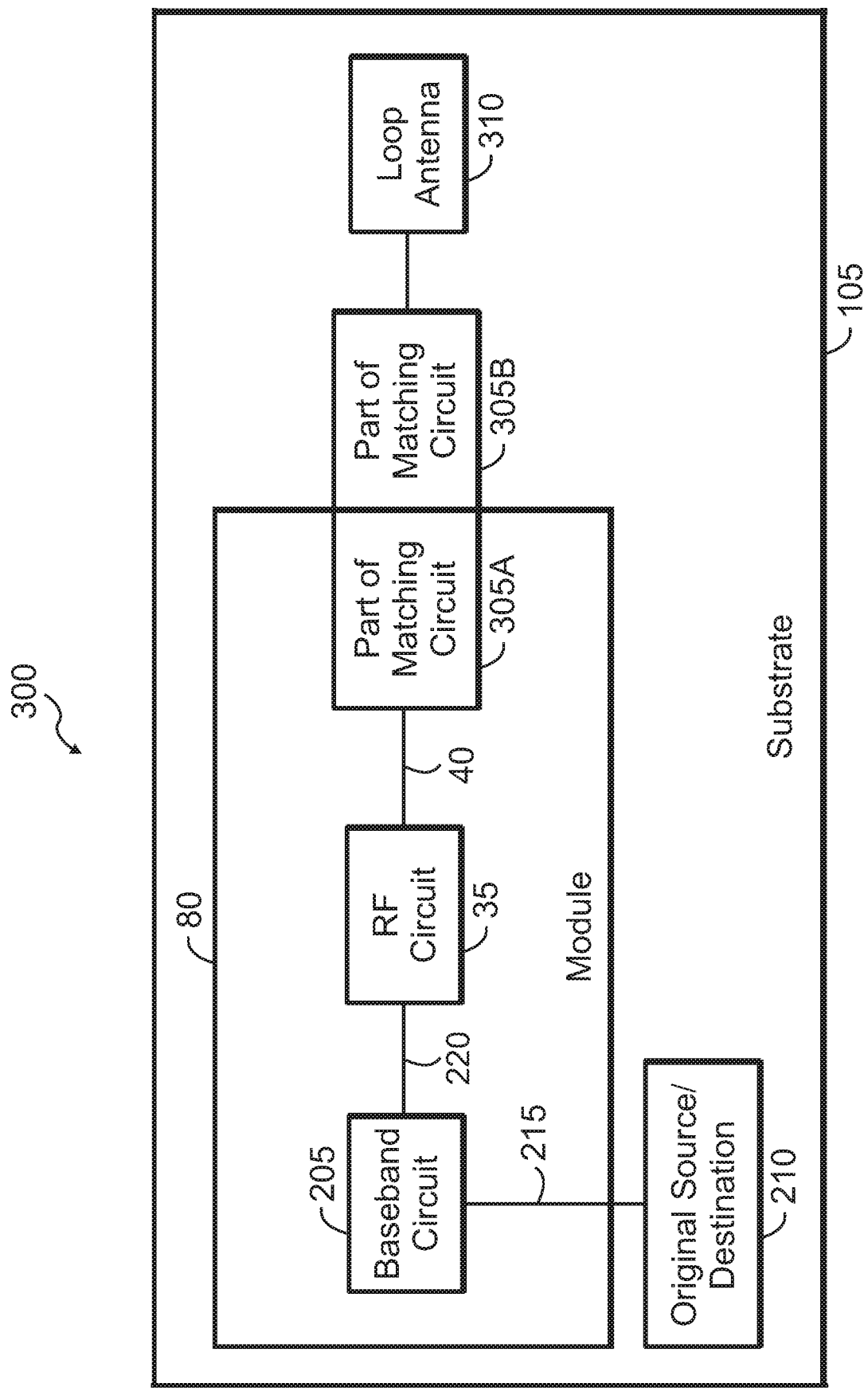
FIG. 17 shows a circuit arrangement for an RF apparatus (or part of an RF apparatus) according to another exemplary embodiment.

In some embodiments, a portion or part of matching circuit 305 is included in module 80, whereas another portion or part of matching circuit 305 is external to module 80. FIG. 17 shows such an embodiment. Similar to the embodiment of FIG. 14, in the embodiment in FIG. 17, a portion 305A of matching circuit 305 is included in module 80. Another portion 305B of matching circuit 305 is external to module 80, for instance, realized using substrate 105, as described above.

Figure 18:
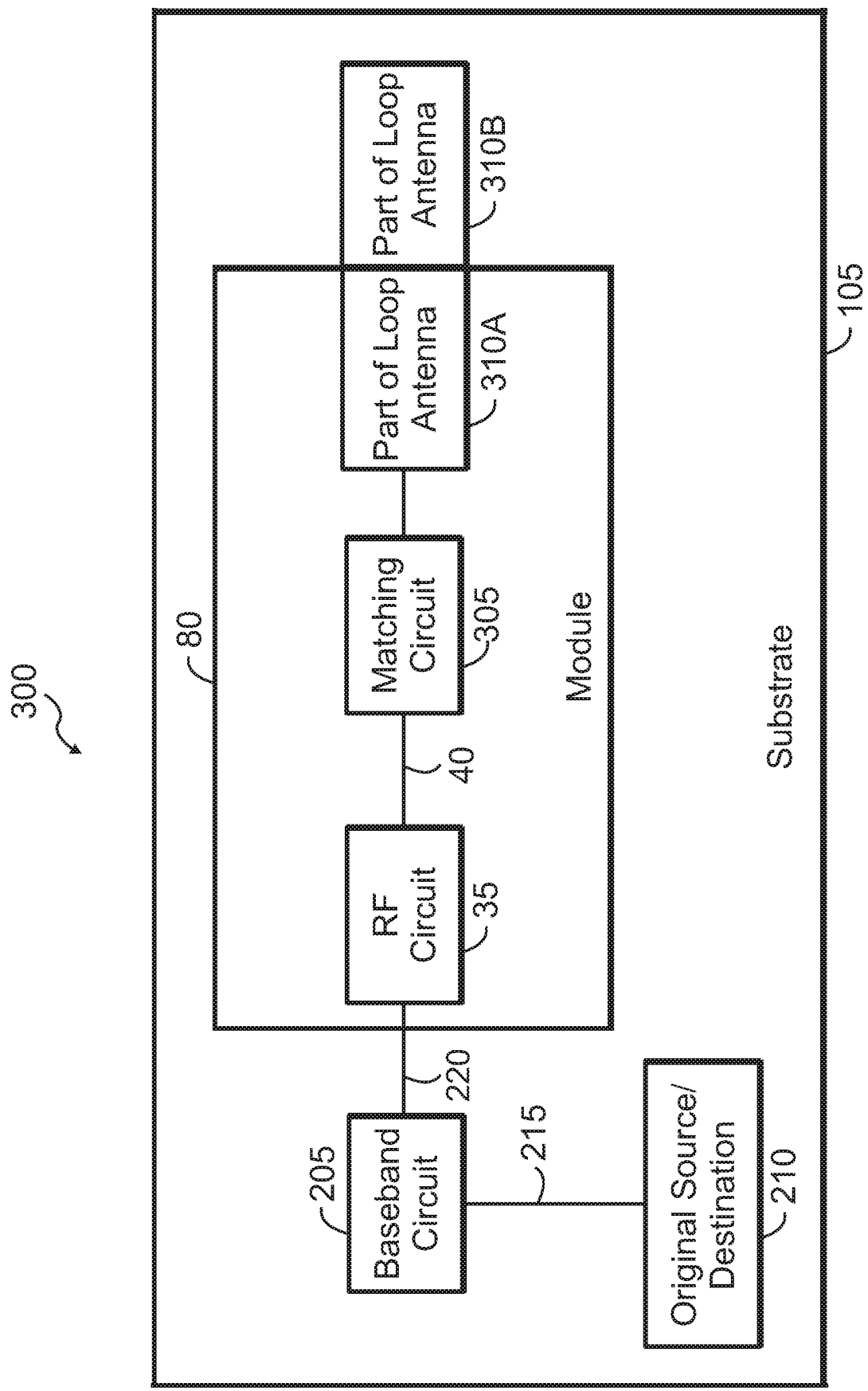
FIG. 18 shows a circuit arrangement for an RF apparatus (or part of an RF apparatus) according to another exemplary embodiment.

In some embodiments, a portion (or part) of loop antenna 310 is included in module 80, whereas another portion of loop antenna 310 is external to module 80. FIG. 18 shows such an embodiment. Similar to the embodiment of FIG. 15, in the embodiment in FIG. 18, a portion 310A of loop antenna 310 is included in module 80. Another portion 310B of loop antenna 310 is external to module 80, for example, realized using substrate 105, as described above.

Figure 19:
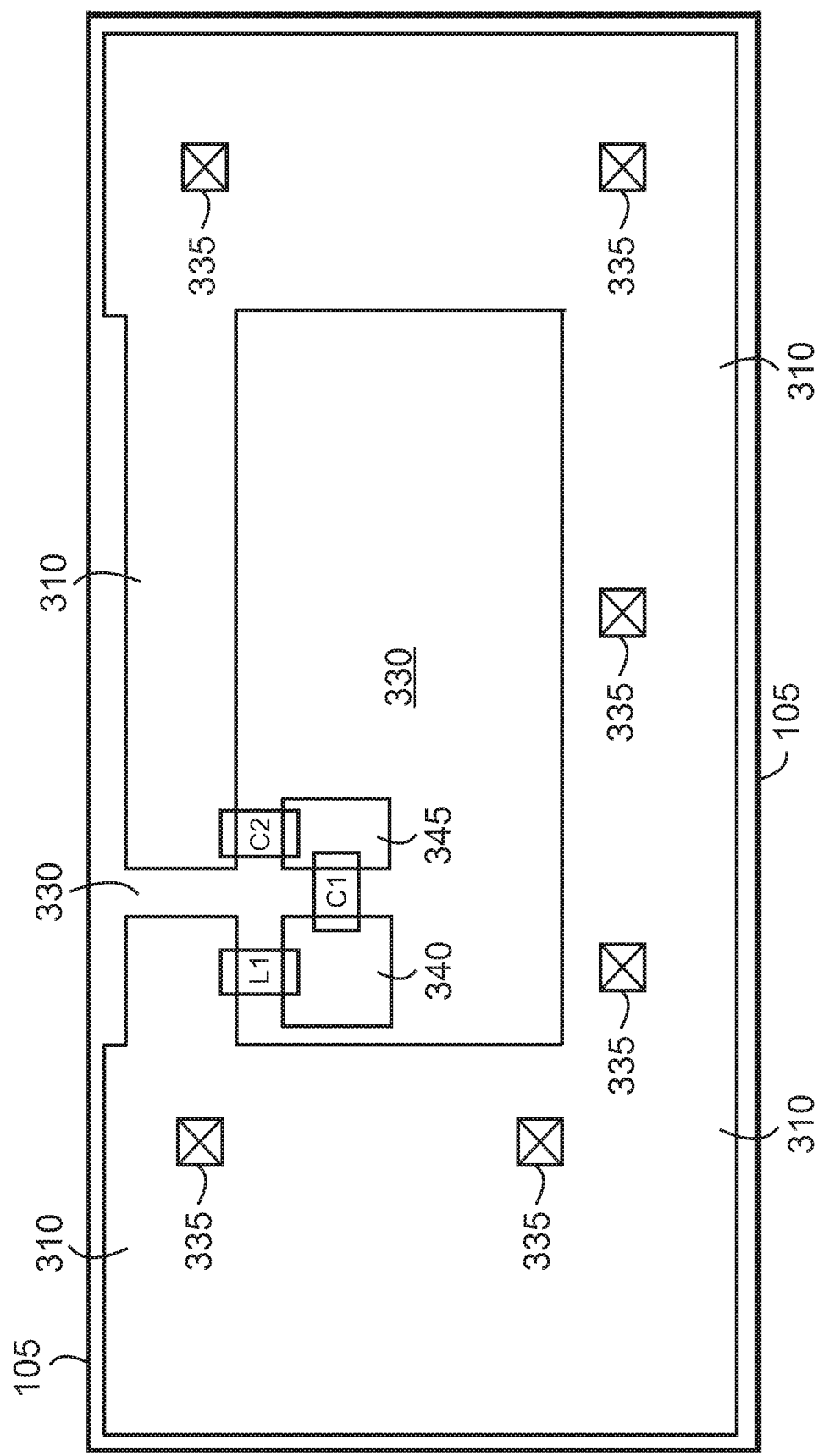
FIG. 19 shows a layout for an RF apparatus (or part of an RF apparatus) according to an exemplary embodiment.

Another aspect of the disclosure relates to the physical layout of matching circuit 305 and antenna loop 310. FIG. FIG. 19 shows a layout for an RF apparatus (or part of an RF apparatus) according to an exemplary embodiment. More specifically, FIG. 19 shows a loop antenna that is implemented as a printed-loop-substrate-edge fringing field antenna. In other words, loop antenna 310 uses a conductive loop, implemented as an example using conductive patterns or traces formed in or on substrate 105 (e.g., a PCB), hence the label printed-loop. The conductive loop (e.g., printed-loop) is implemented at or near an edge (as shown in FIG. 19) of substrate 105, i.e., either near one or more edges of substrate 105 (as shown in FIG. 19), or at one or more edges of substrate 105, i.e., with no clearance (or nearly no clearance) between the conductive loop and the edge(s) of substrate 105.

Parts of substrate 105 are not used to implement loop antenna 310, e.g., parts of the conductive layer on a PCB are stripped or edged to generate voids 330 (i.e., areas not covered by a conductive layer). Conductive patterns or traces 340 and 345 are used to implement matching circuit 305. In the example shown, the RF feed is accomplished using conductive pattern 340 (i.e., a receiver (not shown) or transmitter (not shown) is coupled to conductive pattern 340. An inductor L1 is coupled between conductive pattern 340 and loop antenna 310. A capacitor C1 couples conductive pattern 340 to conductive pattern 345. A capacitor C2 is coupled between conductive pattern 345 and loop antenna 310.

Thus, a matching circuit is formed that includes inductor L1 and capacitors C1 and C2. The matching circuit formed in FIG. 19 is merely illustrative, and no limiting. As persons of ordinary skill in the art will understand, other matching circuits may be implemented, using lumped reactive components or elements, as described above, by using such components and one or more conductive patterns in or on substrate 105 to implement desired matching circuits. Loop antenna 310 is resonated by matching circuit 305.

Figure 20:
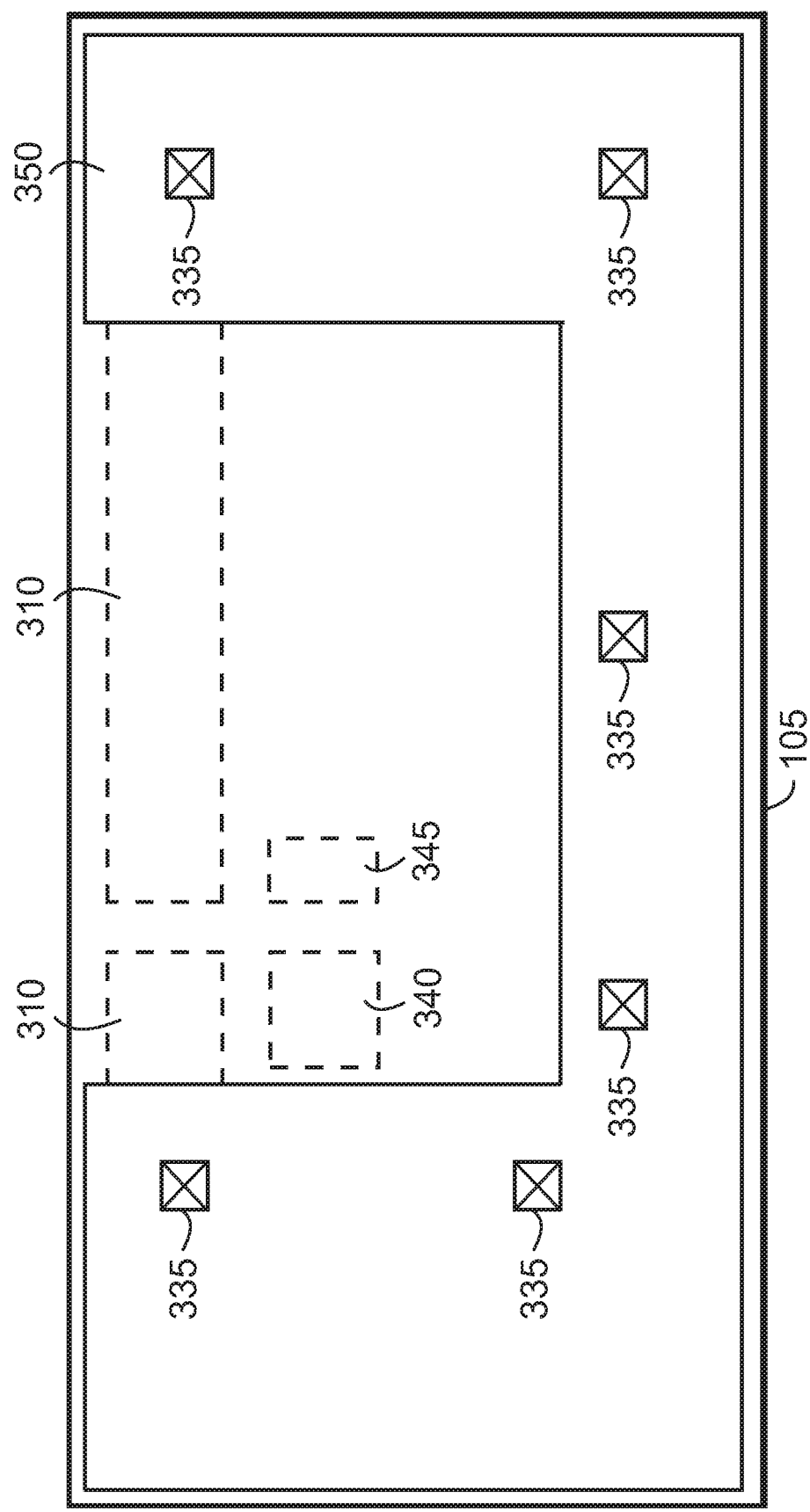
FIG. 20 shows a layout for an RF apparatus (or part of an RF apparatus) according to an exemplary embodiment.

Referring again to FIG. 19, a number of ground vias 335 are used to couple several points of loop antenna 310 to a ground plane (not shown). The ground plane may be formed using one or more internal layers of substrate 105 (e.g., internal layer(s) of a multi-layer PCB), or the bottom layer of substrate 105 (e.g., the bottom layer or reverse side of a PCB). FIG. 20 shows the layout for such an arrangement. More specifically, ground vias 335 couple loop antenna 310 (shown partially using dashed lines as it does not reside in the layer shown) to conductive pattern 350. Conductive pattern 350 constitutes a ground plane and, as noted, may be implemented using one or more internal layers or the bottom or reverse side or layer of substrate 105.

Figure 21:
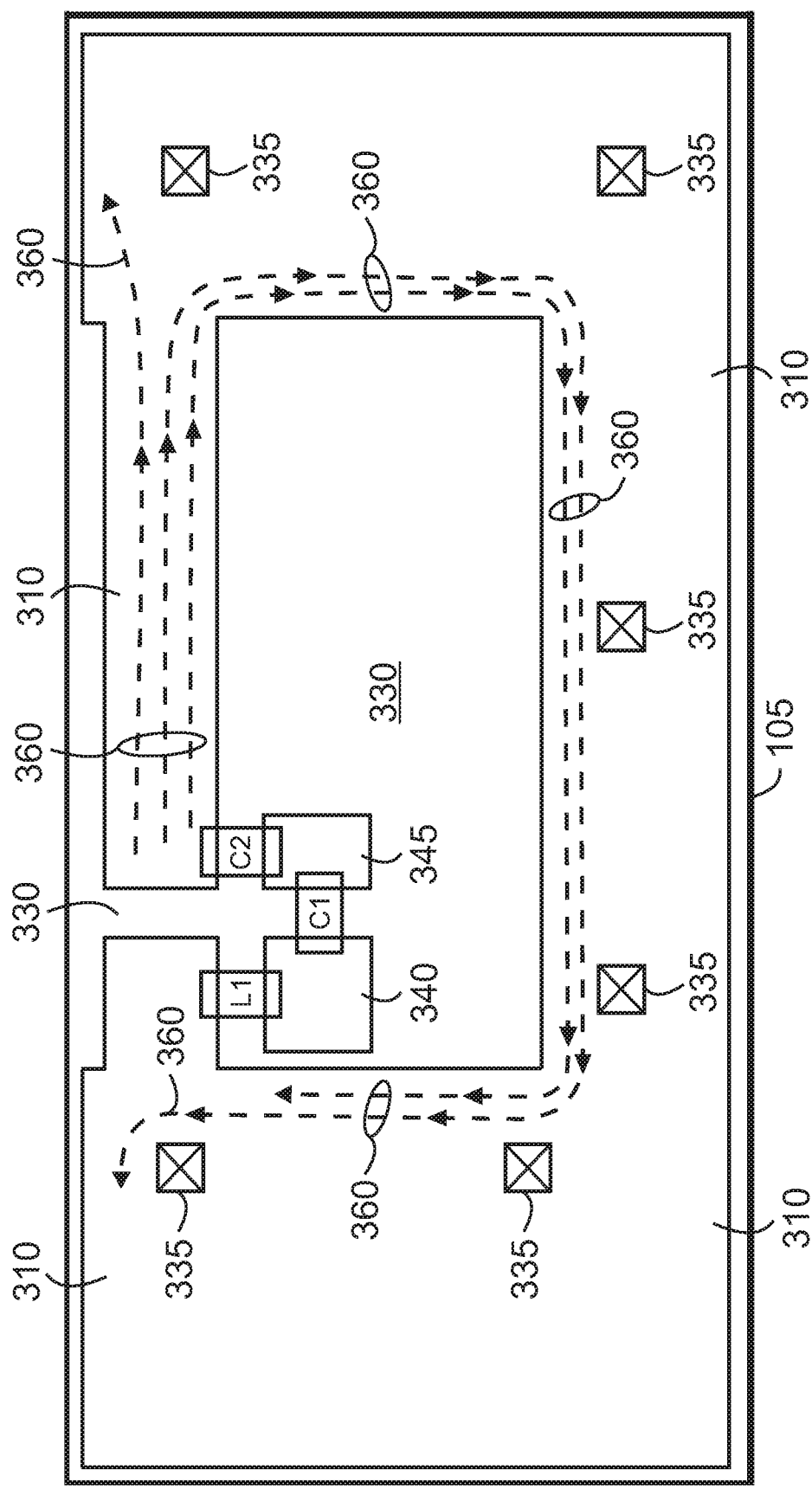
FIG. 21 shows a flow of currents in an RF apparatus (or part of an RF apparatus) according to an exemplary embodiment.

As noted above, loop antenna 310 is resonated by matching circuit 305, which gives rise to RF currents. FIG. 21 shows an example of RF current distribution in the layout shown in FIG. 19. Referring again to FIG. 21, RF currents 360 propagate generally along the top side of substrate 105, along the right side of substrate 105, along the bottom side of substrate 105, and along the left side of substrate 105, thus generating RF radiation. Some fringing currents flow along the top side or edge of substrate 105, as shown in FIG. 21. Such fringing currents generate fringing fields that also generate RF radiation. Note that although generally the conductive loop is radiating, the main radiator is along the edge(s) of substrate 105 because of relatively large size. Thus, without using a chip or ceramic antenna, loop antenna 310 uses the conductive loop and the edge(s) of substrate 105 as radiators, driven by matching circuits that use lumped reactive components or elements.

The size of the conductive loop in loop antenna 310 generally depends on the operating frequency (e.g., the frequency of an RF signal transmitted via loop antenna 310, or the frequency of an RF signal received via loop antenna 310). Thus, the size of the conductive loop and/or substrate 105 may be selected in order to accommodate desired operating frequencies. Various shapes of the conductive loop are also possible, and contemplated. Some conductive loops may be shaped and dimensioned so as to increase the bandwidth of loop antenna 310, or to accommodate relatively limited areas available around module 80 on substrate 105.

Generally, several techniques may be used to improve the performance of loop antenna 310: (a) using relatively narrow traces, relatively far from module 80, in order to decrease the loop area/dimensions that gives rise to self-capacitance; (b) increasing the distance between the conductive loop coupling mechanisms (pins, etc.) to reduce the parallel parasitic capacitance with matching circuit 305); and (c) increased conductive loop width and length to widen the bandwidth. Note that larger conductive loop areas may be achieved in a variety of ways, for instance, by widening the conductive loop, or by making it longer, which decreases the quality factor (Q) of the conductive loop, i.e., decrease the imaginary part of its impedance compared to the real part of its impedance.

Figure 22:
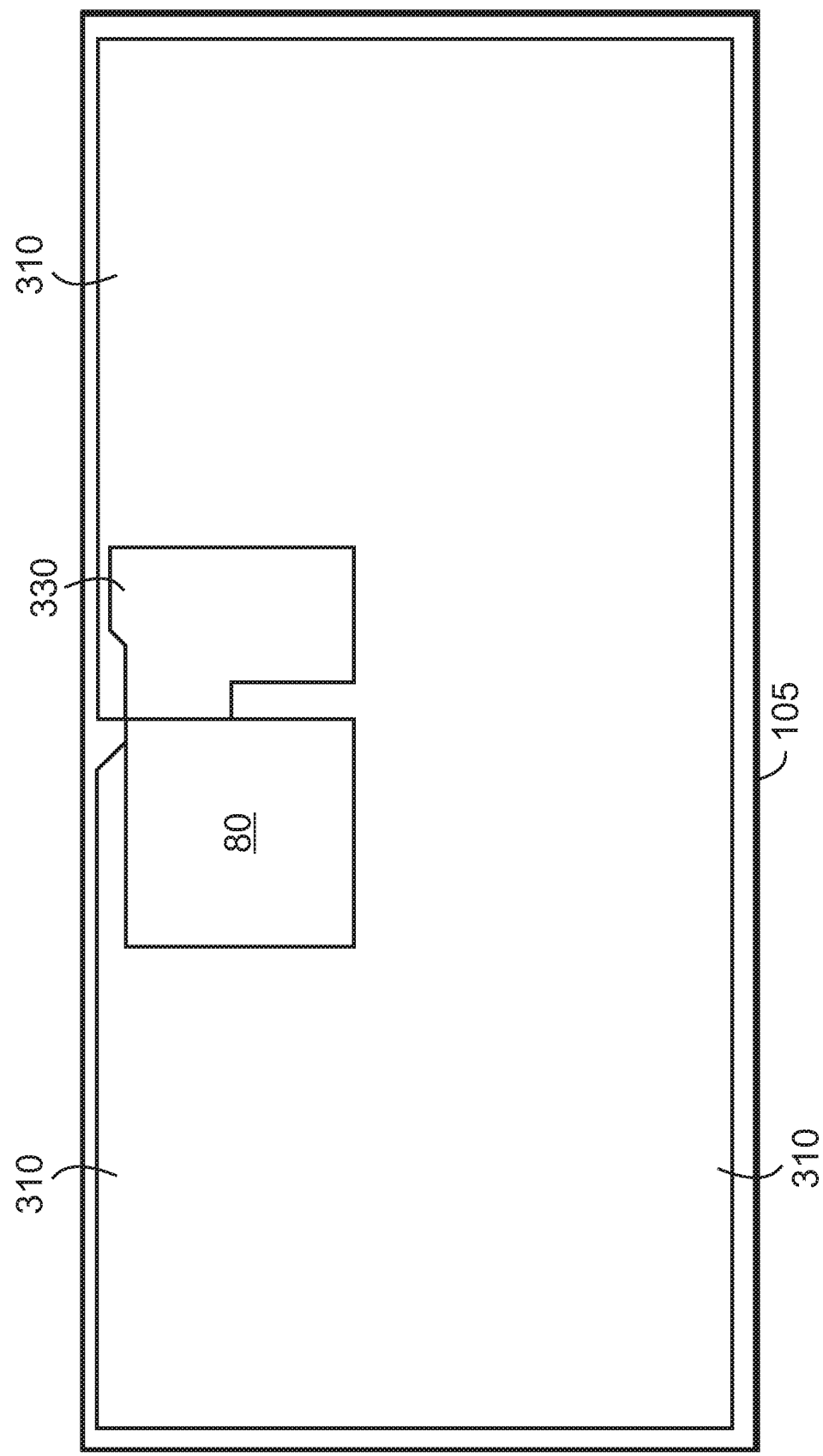
FIG. 22 shows a layout for an RF apparatus (or part of an RF apparatus) according to an exemplary embodiment.

As noted above, in some embodiments, a portion of matching circuit 305 (see, for example, FIG. 17) or a portion of loop antenna 310 (see FIG. 18) is included in module 80. In such embodiments, another portion of matching circuit 305 (see, for example, FIG. 17) or a portion of loop antenna 310 (see FIG. 18), respectively, is external to module 80, e.g., formed using substrate 105. FIG. 22 shows a layout for such embodiments. More specifically, module 80 is positioned (typically mounted or affixed or attached) with respect to substrate 105. Module 80 is electrically coupled to loop antenna 310. As noted in some embodiments, a portion of matching circuit 305 is included in module 80, whereas another portion of matching circuit 305 is laid out externally to module 80. Furthermore, as noted in some embodiments, a portion of loop antenna 310 is included in module 80, whereas another portion of loop antenna 310 is laid out externally to module 80.

Another aspect of the disclosure relates to the topology of matching circuits 305. Loop antenna 310, for example, a printed-loop antenna, usually exhibits an inductive impedance. More specifically, with increasing lengths, the conductive loop impedance approaches the high impedance point of a Smith chart, as the loop impedance approaches its self parallel resonance point. The parallel self resonator is formed by the loop inductance and by the fringing field parasitic capacitance. To act as an antenna, the conductive loop is usually used below its self resonant frequency, which means it exhibits an inductive impedance. The conductive loop, however, can be used also above its self resonance frequency, where it exhibits capacitive impedance. In either case, a variety of matching circuits may be used with loop antenna 310. Some examples are described and illustrated in U.S. patent application Ser. No. 16/237,511, cited above.

Figure 23:
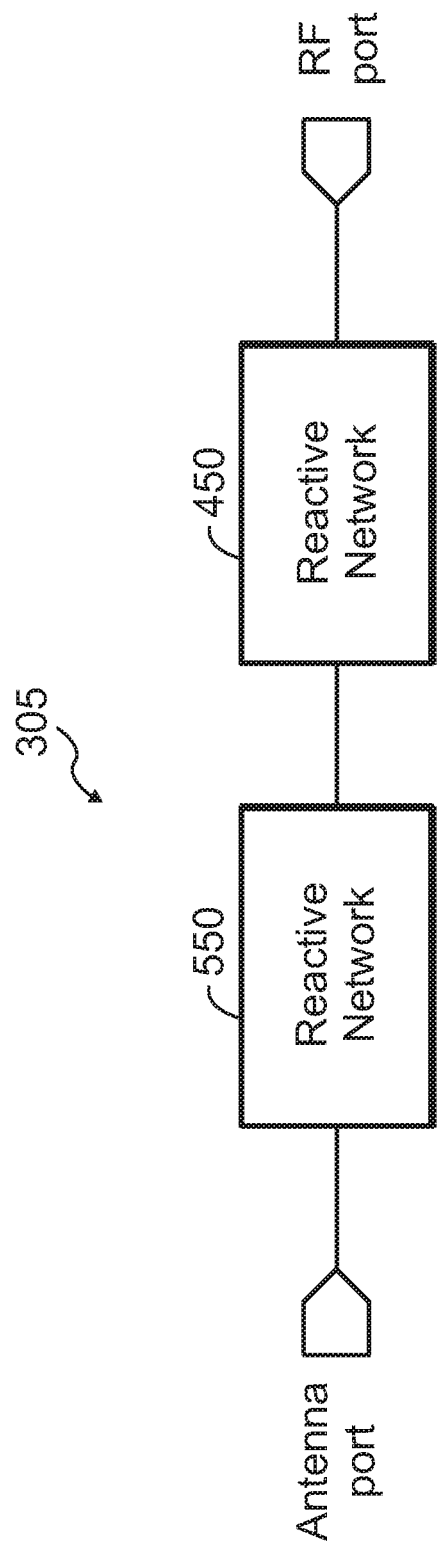
FIG. 23 shows a circuit arrangement for antenna matching circuitry according to an exemplary embodiment.

FIG. 23 shows a matching circuit according to an exemplary embodiment. More specifically, matching circuit 305 in FIG. 23 includes reactive network 450 coupled in series or cascade with reactive network 550. Reactive networks 450 and 550, as the name suggests, include one or more inductors and/or capacitors. Reactive networks 450 and 550 may have a variety of topologies, for example, as described and illustrated in U.S. patent application Ser. No. 16/237,511, cited above.

Figure 24:
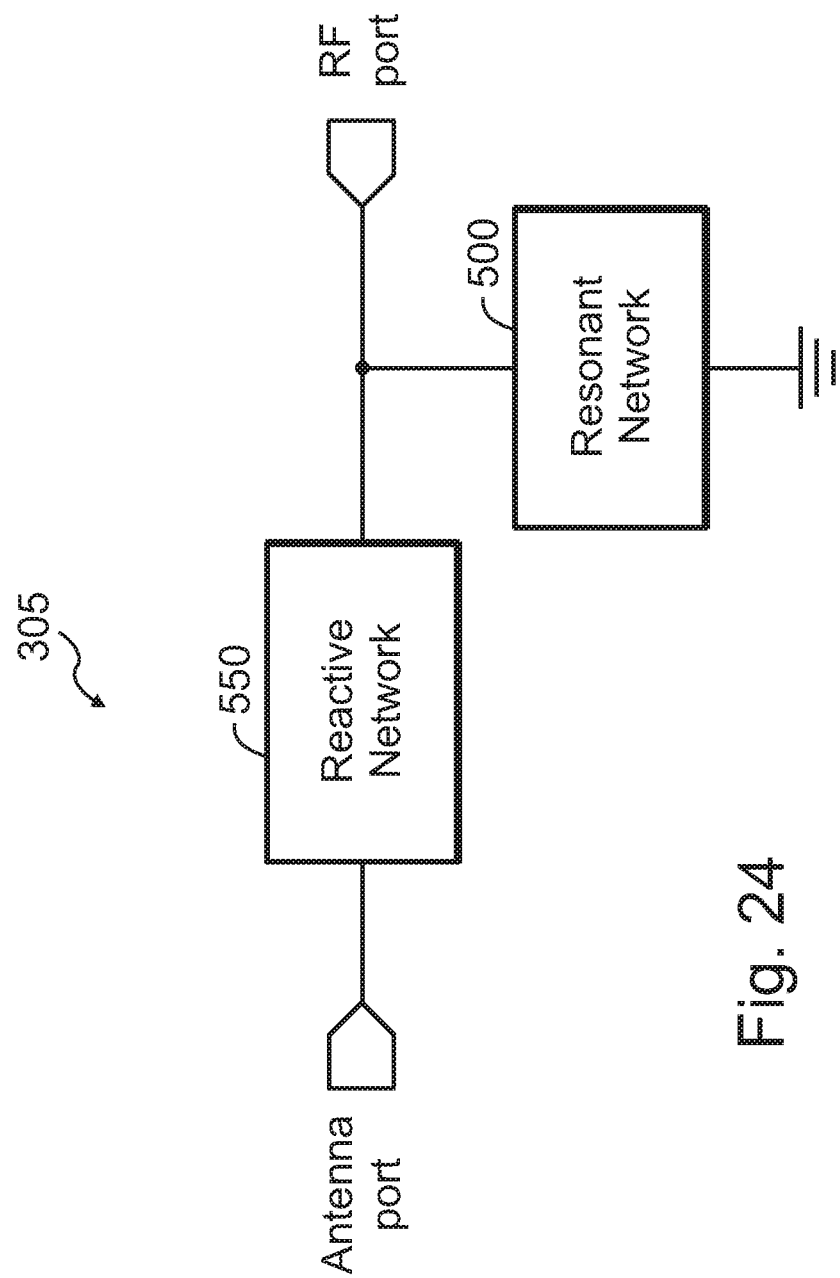
FIG. 24 shows a circuit arrangement for antenna matching circuitry according to another exemplary embodiment.

FIG. 24 shows a matching circuit according to another exemplary embodiment, which uses a shunt resonant network and a reactive network. More specifically, matching circuit 305 in FIG. 24 includes resonant network 500 coupled in shunt with the RF port of matching circuit 305, i.e., between the RF port and ground. Resonant network 500 is also coupled to reactive network 550. Reactive network 550 is coupled in series or cascade with the antenna port of matching circuit 305. Resonant networks 500, as the name suggests, include one or more inductors coupled to one or more respective capacitors to form a resonant circuit or tank or network. Reactive network 550 and resonant network 500 may have a variety of topologies, for example, as described and illustrated in U.S. patent application Ser. No. 16/237,511, cited above.

Figure 25:
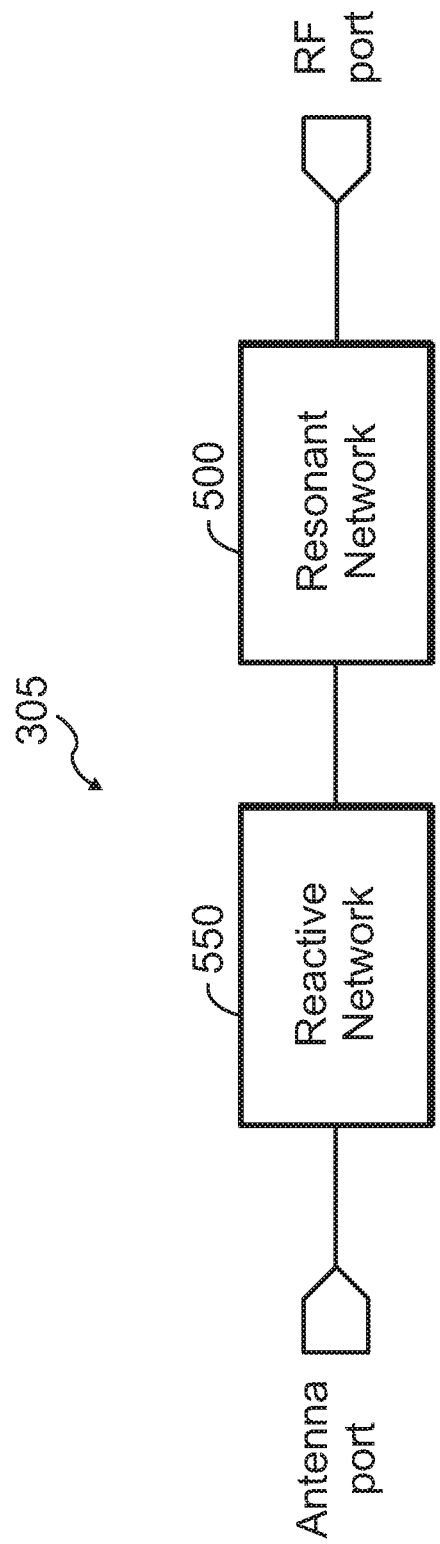
FIG. 25 shows a circuit arrangement for antenna matching circuitry according to another exemplary embodiment.

FIG. 25 shows a matching circuit according to another exemplary embodiment, which uses a series resonant network and a reactive network. More specifically, matching circuit 305 in FIG. 25 includes resonant network 500 coupled in series with reactive network 550. Reactive network 550 and resonant network 500 may have a variety of topologies, for example, as described and illustrated in U.S. patent application Ser. No. 16/237,511, cited above.

Figure 26:
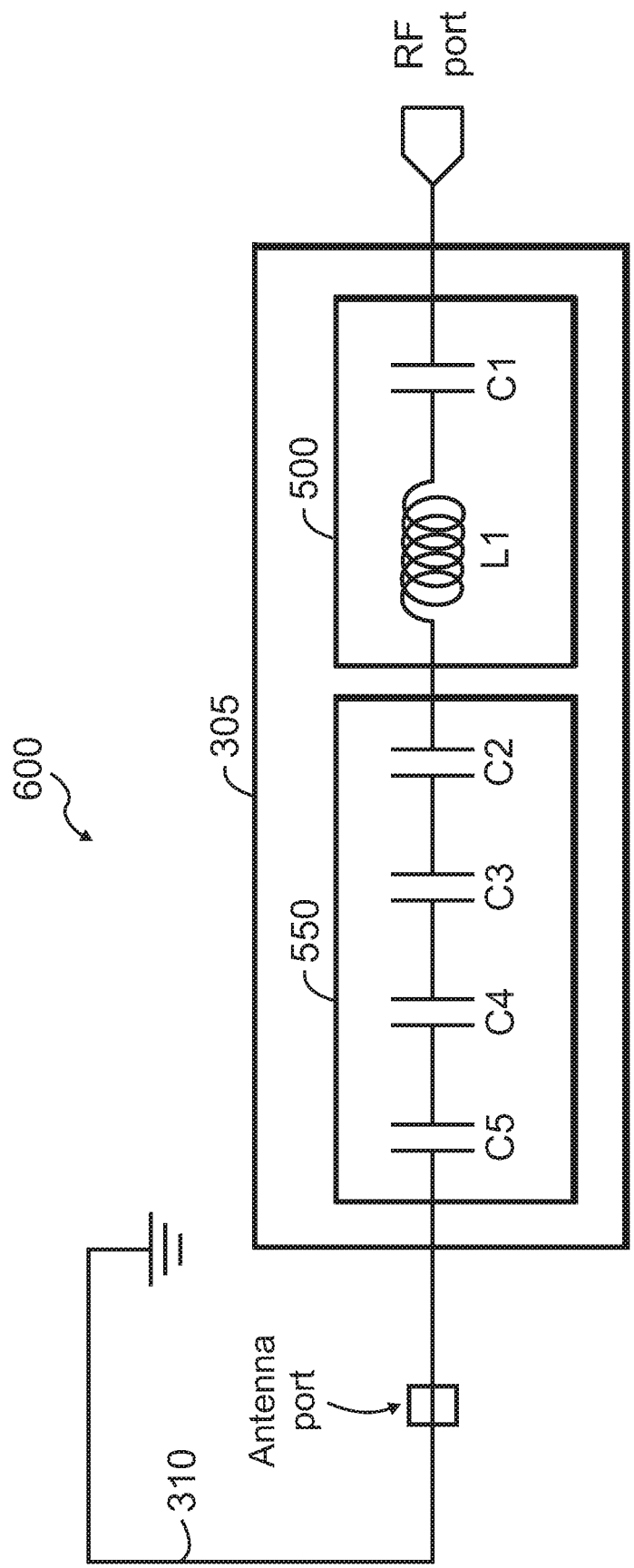
FIG. 26 shows a circuit arrangement for an RF apparatus (or part of an RF apparatus) according to another exemplary embodiment.

FIG. 26 illustrates a circuit arrangement 600 for a matching network 305 coupled to loop antenna 310. One end of loop antenna 310 is coupled to ground (e.g., using ground vias, described above). Another end of loop antenna 310 is coupled to the antenna port of matching circuit 305. In the particular example shown, matching circuit 305 generally has a topology similar to the topology in FIG. 25. More specifically, matching circuit 305 includes a resonant circuit 500 that uses inductor L1 in series with capacitor C1. Matching circuit 305 further includes a reactive network 550, which includes a single capacitor split into four series-coupled (or cascade-coupled) capacitors C2-C5 (to reduce sensitivity to component variations or tolerances, for example, as described and illustrated in U.S. patent application Ser. No. 16/237,511, cited above. The example in FIG. 26 does not use a shunt-coupled network, because in the particular case illustrated, parallel parasitics present in the circuit (e.g., the conductive loop, etc.) shift the impedance close to the nominal resistance (e.g., 50Ω) circle of the Smith chart. In other situations, a shunt network may be appropriate and may be used, for example, as described and illustrated in U.S. patent application Ser. No. 16/237,511, cited above.

Matching circuit 305 or loop antenna 310 may be partitioned, e.g., into portions, respectively, where one portion is included in a module (not shown) and another portion that is external to the module, as described above. Furthermore, although various embodiments are described with respect to loop antennas, other types of antenna may be used, as persons of ordinary skill in the art will understand. The choice of antenna depends on various factors, such design specifications, performance specifications, cost, substrate characteristics and dimensions, module (if used) characteristics and dimensions, available technology, target markets, target end-users, etc., as persons of ordinary skill in the art will understand.

According to another aspect of the disclosure, one or more external capacitors (i.e., capacitors external to module 80) are used, which together with the matching circuit act as tuning elements. The addition of the external capacitors: (a) provides additional degrees of freedom and level of tuning; (b) achieves higher immunity against technological spreading by using capacitor(s) in matching circuits with larger capitance values with less relative spreading; (c) enables the use of larger loop sizes for loop antenna 310, which improves radiation and thus, reduces Q values; and (d) improves immunity against technological spreading because of the reduced Q value. Other attributes and advantages of using external capacitor(s) according to various embodiments are described below in detail.

Figure 27:
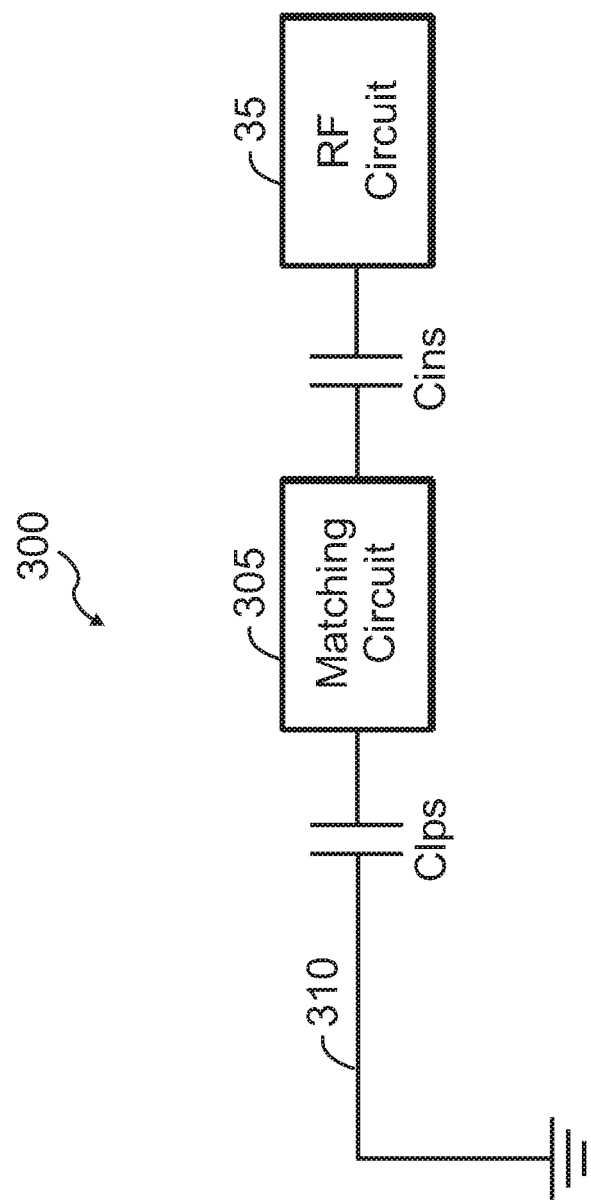
FIG. 27 shows a circuit arrangement for an RF apparatus (or part of an RF apparatus) according to an exemplary embodiment.

FIG. 27 shows a circuit arrangement for an RF apparatus (or part of an RF apparatus) 300 according to an exemplary embodiment. RF circuit 35 is coupled through optional external capacitor Cins to matching circuit 305. Matching circuit 305 is coupled via external capacitor Clps. Capacitor Clps is coupled to loop antenna 310. Thus, compared to the embodiments described above (e.g., the embodiment shown in FIG. 13), RF apparatus 300 includes capacitor Clps and, optionally, capacitor Cins.

Loop antenna 310 uses a conductive trace (e.g., a trace on substrate 105, such as a trace on a PCB) to form a loop antenna, as described above. Loop antenna 310 is coupled to circuit ground, for example, by using vias, as described below. Matching the impedance of the inductive loop to a 50 Ω source impedance is performed by matching circuit 305. Note that, in some embodiments, RF circuit 35 may include an additional impedance matching circuit (not shown in the embodiment in FIG. 27) to account for the presence of optional external capacitor Cins. In exemplary embodiments, the parallel capacitance to ground is achieved typically by parasitic coupling of the component terminals (e.g., solder terminals) and conductive traces (e.g., on substrate 105, such as a PCB) to the nearby module shield (not shown) and the ground plane. Matching the inductive loop typically entails balancing the components values of the series capacitance with the parallel parasitic capacitance.

A larger inductive loop size may be used to achieve wider bandwidth and stability of the return loss coefficient over a specific frequency band of operation of loop antenna 310. Increasing the loop size of loop antenna 310 may provide antenna performance improvements, but depending on design and performance specifications may entail tradeoffs. The presence of external capacitor Clps will offset or diminish the tradeoffs, yet maintain the improvements. Increasing the loop size increases the inductance in proportion to the increase in loop area, which leads to the use smaller value series capacitors in matching circuit 305 to offset the increase in inductance. The smaller capacitor values makes the production tolerance become a higher percentage of the capacitance value, which increases variation in antenna performance, and leads to a reduction in manufacturing yield. The presence of external capacitor Clps offsets the increase in inductance, or even reduces the loop inductance below its initial value. This attribute can maintain or increase the value of series capacitors in matching circuit 305. The increase in value reduces the impact of component tolerances on antenna performance variation and manufacturing yield. Increasing the loop size also increases the radiation, as manifested by an increase of the real part of the impedance of loop antenna 310, as seen at the antenna port of matching circuit 305. The increase of the real part of the impedance is proportional to the square of the increase of the loop area. This result improves the performance, reduces the loss, reduces the variation, and is easier to match the impedance of loop antenna 310 as seen at the antenna port to the impedance of the RF Port matching circuit, which is the task of matching circuit 305. Furthermore, in some embodiments, external capacitor Clps may be located physically further away from ground (as described below) than other components in the circuit, and therefore provides lower parasitic capacitance to ground, which also reduces any negative impact to the performance of the parasitic capacitance.

In exemplary embodiments, capacitor Clps (in some embodiments placed relatively far from ground areas or the module shield), reduces the ratio of the imaginary part of the impedance to the real part of the impedance, and diminishes the adverse effects of the parasitic capacitance discussed above. As a result, larger loop sizes may be used in loop antenna 310, which provides improvement to the overall bandwidth and stability of loop antenna 310.

Placing capacitor Clps externally (i.e., outside) the module allows the capacitance value of capacitor Clps to be tuned for the specific application. Use of capacitor Clps in this manner allows compensating for relatively small design variations between different implementations or designs (i.e., by tuning the capacitance value of capacitor Clps from one design to another) without having to modify, adjust, or tune any components inside the module, such as components in matching circuit 305. Thus, different designs may be tuned by simply tuning the capacitance value of capacitor Clps. Note that variation in the capacitance value of capacitor Clps tends to move the impedance curves close to the constant-admittance real-part curve of on a Smith chart.

Using external capacitor Clps also allows reducing the cost of the shield typically used with the module as part of a certification process. Typically, to obtain certification for various industry and/or regulatory (e.g., Federal Communications Commission (FCC)) compliance specifications, a shield is used over the module (e.g., over the entire module, over the RF circuitry, such as transmitter, receiver, or transceiver, etc.). Use of various components in the module, such as a ceramic antenna, entails cutting or masking off a portion of the shield to reduce the parasitic load and allow the ceramic antenna to function. The cutting or masking off process, however, adds to the cost of the shield, and results in increased fabrication complication (compared to a simple full-coverage shield). By using capacitor Clps in exemplary embodiments, however, RF apparatus 300 can tolerate the increased parasitic couplings, and even use them to advantage, while using a full-coverage shield.

Furthermore, for a given loop size used in loop antenna 310, using external capacitor Clps allows the values of the series capacitor(s), such as used in matching circuit 305) to be increased. The series capacitor(s) typically are relatively tight tolerance parts with fixed absolute variation (e.g., ±50 fF). The ability to use series capacitor(s) with higher capacitance values (by virtue of using external capacitor Clps), the relative variation of the series capacitor(s) is reduced.

As noted above, in some embodiments, optionally a second tuning external capacitor Cins may be coupled between RF circuit 35 and matching circuit 35. Due to the lower parasitics, capacitor Cins tunes the impedance along the constant-resistance curves of the Smith chart (i.e., moves the impedance curves along the constant-resistance curve of the Smith chart) more effectively than the series capacitor(s), such as used in matching circuit 305.

In some embodiments, using external capacitor Clps is sufficient for tuning the antenna impedance to 50 Ω at the matching port of matching circuit 305. In such embodiments, external capacitor Cins may be omitted. In some embodiments, in order to avoid changing the layout of the conductive traces (e.g., PCB maks), the pads/traces corresponding to an omitted capacitor Cins may be shorted with a zero-Ohm resistor or a short.

Figure 28:
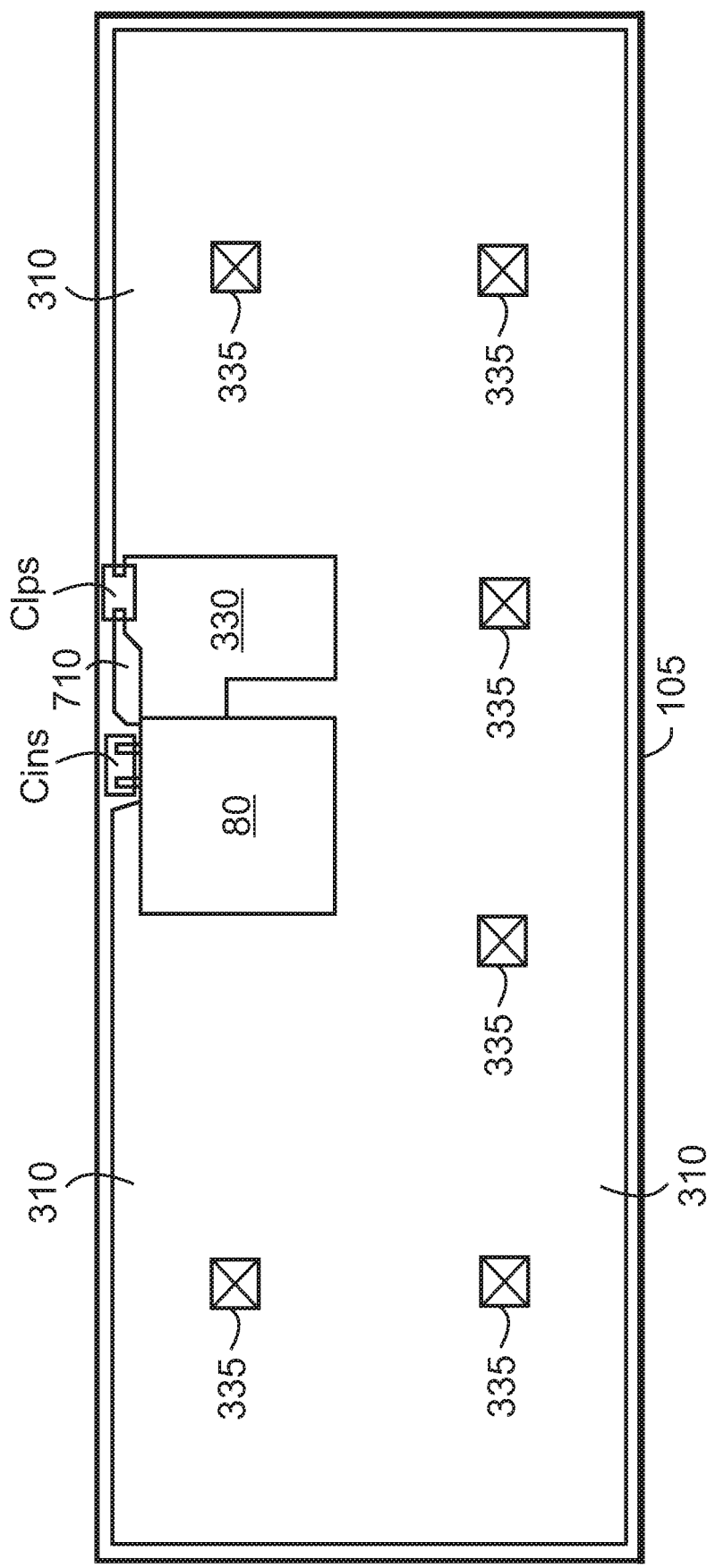
FIG. 28 shows a layout for an RF apparatus (or part of an RF apparatus) according to an exemplary embodiment.

FIG. 28 shows a layout for an RF apparatus (or part of an RF apparatus) according to an exemplary embodiment. FIG. 28 is similar to FIG. 22, but includes external capacitor Clps and optional external capacitor Cins. Referring again to FIG. 28, in the embodiment shown, module 80 is positioned (typically mounted or affixed or attached) with respect to substrate 105. Module 80 is electrically coupled to loop antenna 310 via external capacitor Clps. More specifically, coupling mechanism 710 (e.g., conductive trace on a PCB) is used to couple the output of module 80 to external capacitor Clps. Coupling mechanism 710 may constitute merely a mechanism for electrically coupling module 80 to external capacitor Clps, or may constitute part of loop antenna 310, as described below. If used, optional external capacitor Cins is included, and is coupled to module 80.

Figure 29:
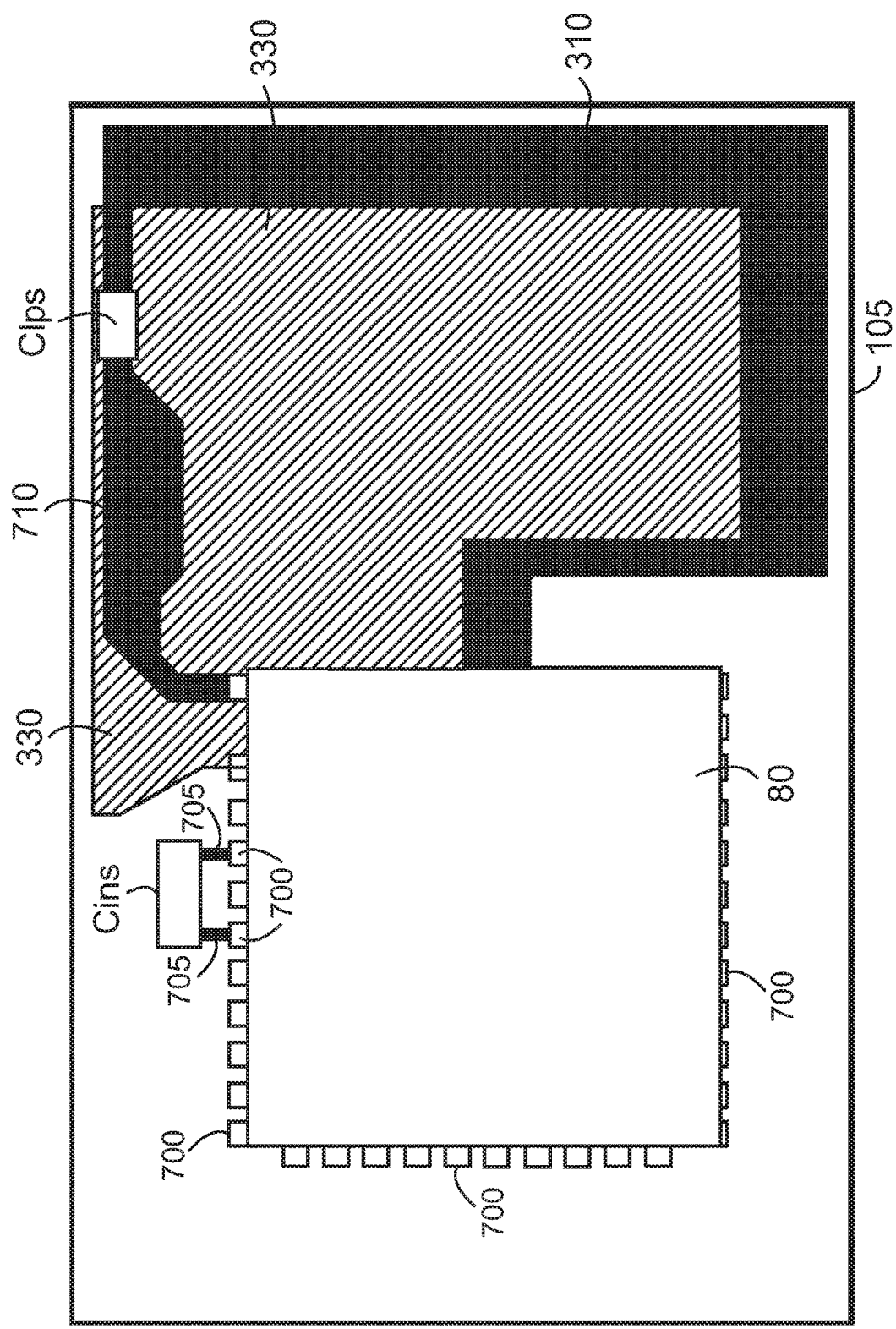
FIG. 29 shows a layout for an RF apparatus (or part of an RF apparatus) according to an exemplary embodiment.

FIG. 29 more details of the layout of an RF apparatus that uses external tuning capacitors (i.e., capacitor Clps and, if used, optional capacitor Cins). Note that, compared to FIG. 28, loop antenna 310 in FIG. 29 has a different shape and layout, and is generally smaller/shorter. Referring again to FIG. 29, module 80 uses or includes a set of pins, pads, or generally a coupling mechanism 700 in order to electrically couple module 80 to other circuit elements. Module 80 (e.g., a matching circuit (not shown) included in module 80 and coupled to a coupling mechanism 700) in FIG. 29 is coupled to external capacitor Clps via coupling mechanism 710. Capacitor Clps is coupled to loop antenna 310 (see FIG. 27 for the circuit topology). If external capacitor Cins is used, a pair of coupling mechanisms 700 of module 80 are used to couple capacitor Cins to module 80 via traces 705 (or other desired coupling mechanism). If external capacitor Cins is not used, traces 705 may be omitted, or a short or zero-Ohm resistor may be used, as described above. As noted above, in some embodiments, external capacitor Clps may be placed physically further from the portions of loop antenna 310 that are coupled to ground through ground vias 335. In such embodiments, external capacitor Clps is coupled to the grounded (through ground vias 335) portions of loop antenna 310 through a conductive trace. Such an arrangement may further minimize parasitic coupling from external capacitor Clps (e.g., from the terminals of the capacitor) to ground.

Figure 30:
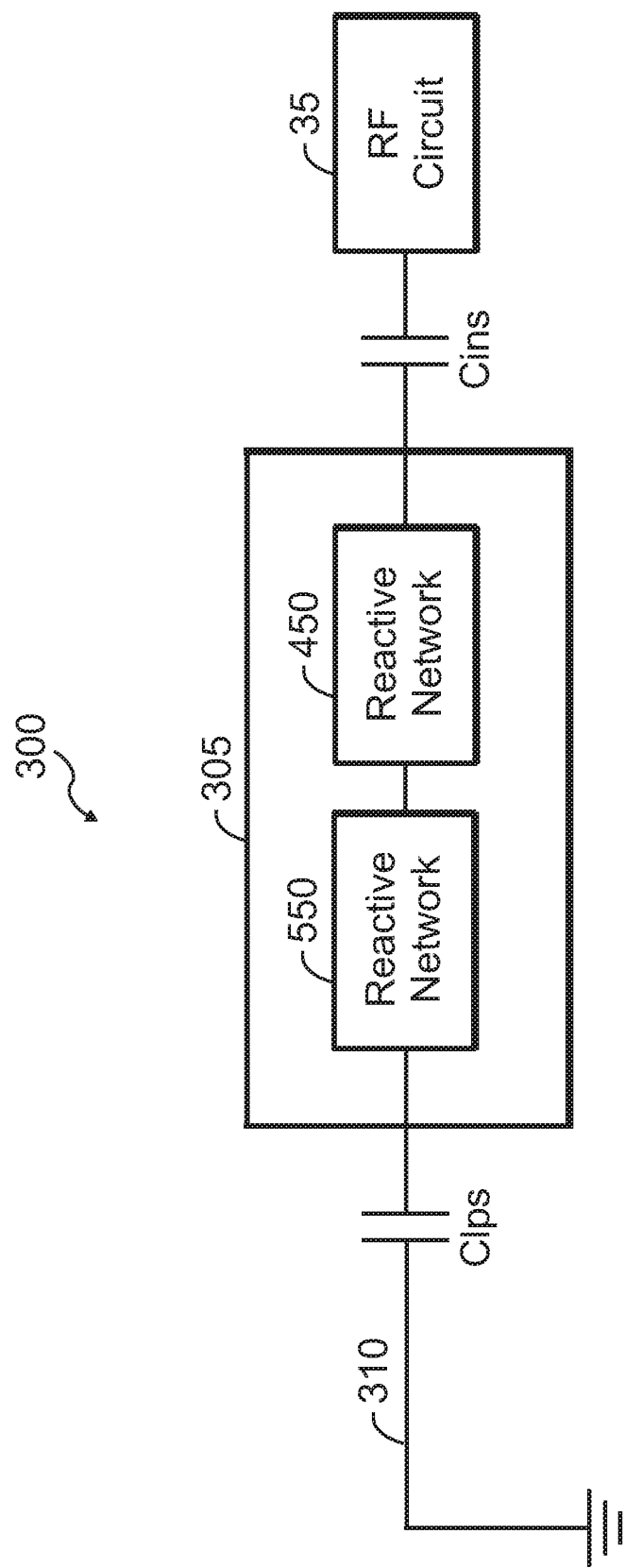
FIG. 30 shows a circuit arrangement for an RF apparatus (or part of an RF apparatus) according to another exemplary embodiment.
Figure 31:
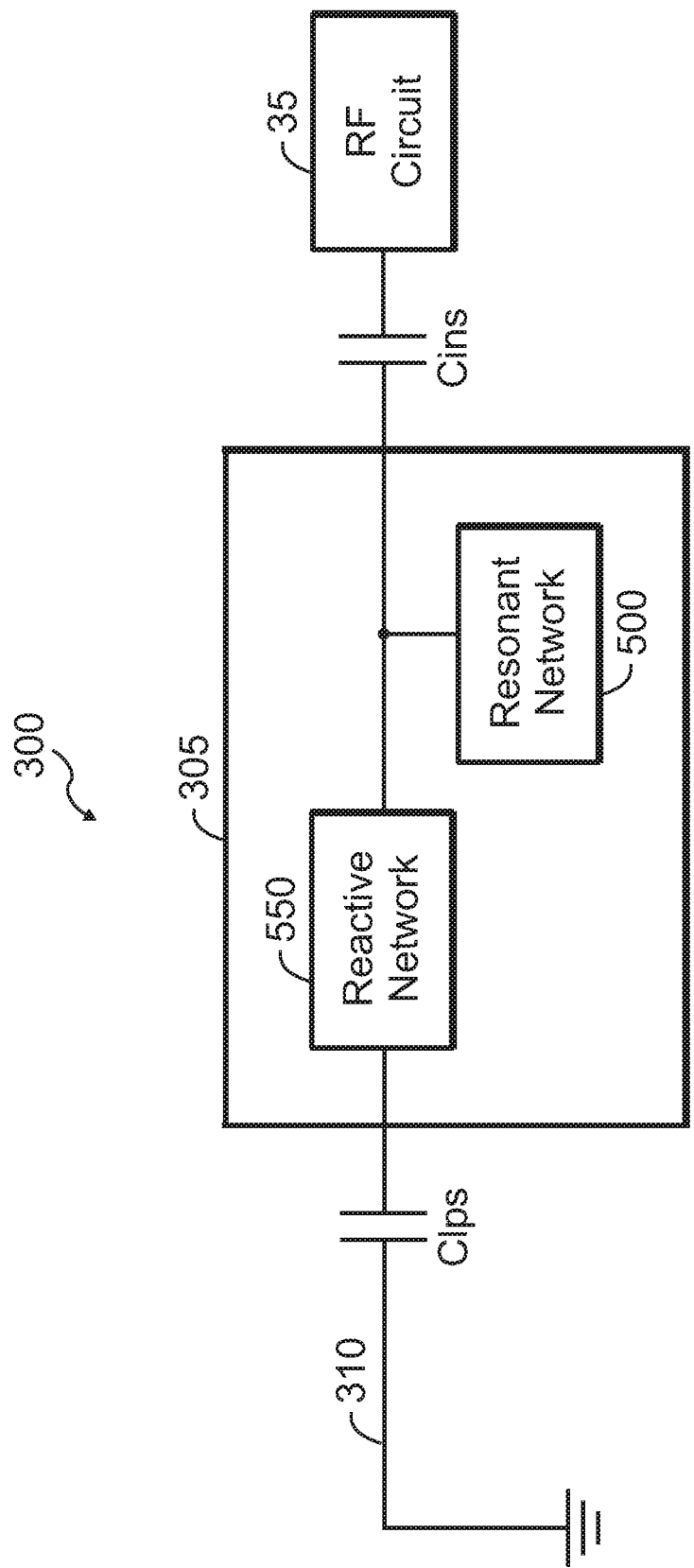
FIG. 31 shows a circuit arrangement for an RF apparatus (or part of an RF apparatus) according to another exemplary embodiment.
Figure 32:
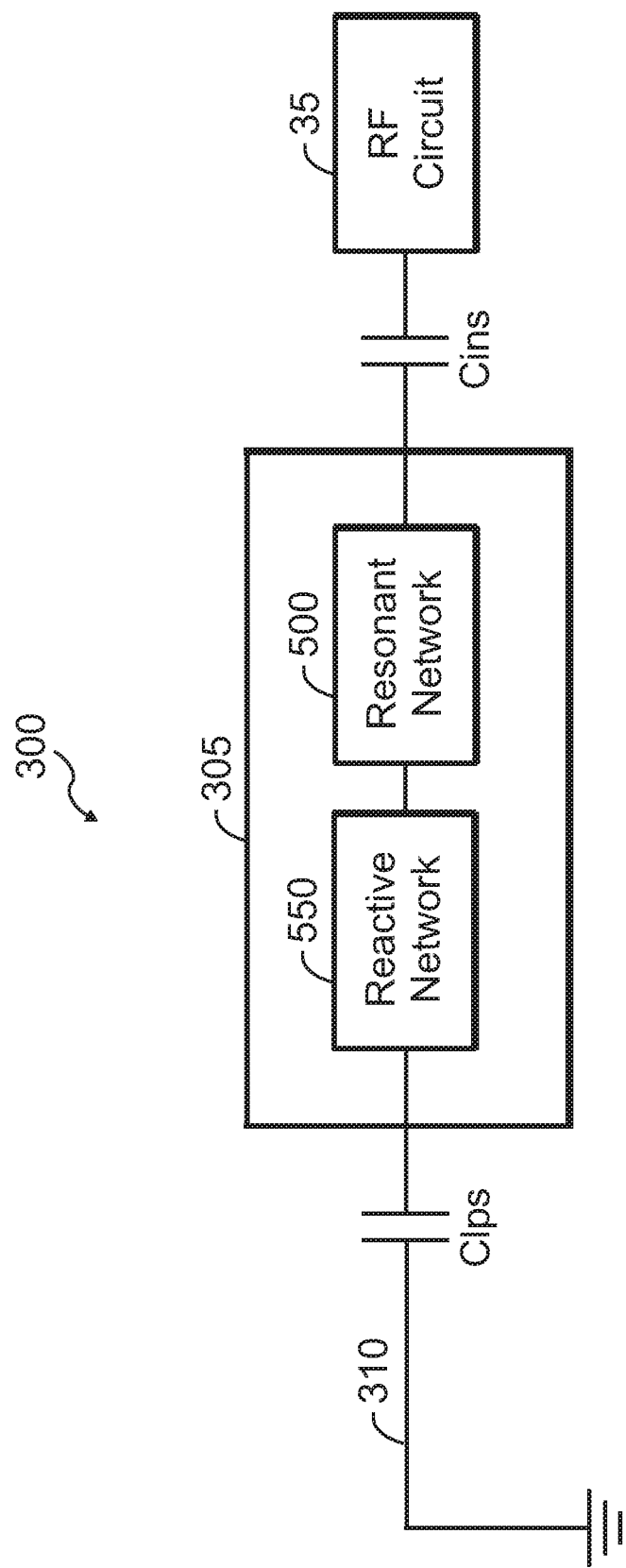
FIG. 32 shows a circuit arrangement for an RF apparatus (or part of an RF apparatus) according to another exemplary embodiment.

External capacitor Clps, and external capacitor Cins, if used, may be used with a variety of types and topologies of matching circuit 305. FIGS. 30-32 show circuit arrangements for RF apparatus (or part of an RF apparatus) with exemplary topologies of matching circuits 305. More specifically, FIGS. 30-32 show, respectively, matching circuits 305 in FIGS. 23-25 used as matching circuit 305 in FIG. 27.

Referring to FIG. 30, matching circuit 305 includes reactive network 450 coupled in series or cascade with reactive network 550. Reactive networks 450 and 550, as the name suggests, include one or more inductors and/or capacitors. Reactive networks 450 and 550 may have a variety of topologies, for example, as described above, and/or as described and illustrated in U.S. patent application Ser. No. 16/237,511, cited above.

Referring to FIG. 31, matching circuit 305 uses a shunt resonant network and a reactive network. More specifically, matching circuit 305 in FIG. 31 includes resonant network 500 coupled in shunt with the RF port of matching circuit 305. Resonant network 500 is also coupled to reactive network 550. Reactive network 550 is coupled in series or cascade with the antenna port of matching circuit 305. Resonant networks 500, as the name suggests, include one or more inductors coupled to one or more respective capacitors to form a resonant circuit or tank or network. Reactive network 550 and resonant network 500 may have a variety of topologies, for example, as described above, and/or as described and illustrated in U.S. patent application Ser. No. 16/237,511, cited above.

Referring to FIG. 32, matching circuit 305 uses a series resonant network and a reactive network. More specifically, matching circuit 305 in FIG. 32 includes resonant network 500 coupled in series with reactive network 550. Reactive network 550 and resonant network 500 may have a variety of topologies, for example, as described above, and/or as described and illustrated in U.S. patent application Ser. No. 16/237,511, cited above.

Note that, although FIGS. 28-29 show situations where matching circuit 305 is included in module 80, other possibilities exist and are contemplated. More specifically, in various embodiments, matching circuit 305 may be included entirely in module 80 or, alternatively, may be partitioned, as described above. In other words, a portion (or part) of the circuitry for matching circuit 305 is included in module 80, whereas another portion of matching circuit 305 is included in or formed in or formed on or formed using substrate 105 (e.g., as shown in FIG. 14, and described above). In some embodiments, matching circuit 305 may include or may constitute a transformer. Furthermore, in some embodiments, matching circuit 305 may be omitted, and external capacitors Clps and Cins may be used to provide impedance-matching functionality.

In some embodiments, loop antenna 310 is not partitioned, and the entire loop antenna is external to module 80. In such situations, coupling mechanism 710 electrically couples module 80 to external capacitor Clps, which in turn is coupled to loop antenna 310 (or coupled to loop antenna 310 via a conductive trace, as discussed above). In some embodiments, loop antenna 310 is realized externally to module 80, and coupling mechanism 710 is part of the loop antenna. In other words, in such embodiments, coupling mechanism 710 and loop antenna 310 together form the overall loop antenna, with external capacitor Clps (and, in some embodiments, an additional conductive trace, as discussed above) coupled between them, as shown.

In some embodiments, however, the loop antenna is partitioned with a portion of the loop antenna residing within module 80 (e.g., as shown in FIGS. 6, 9, 10, 15, 18, etc. In such embodiments, a portion (or part) of loop antenna 310 is included in module 80, whereas one or more portions of the loop antenna is included in or formed in or formed on or formed using substrate 105. In such embodiments, the portion or part of the loop antenna that is included in module 80 is coupled to external capacitor Clps via coupling mechanism 710 (a part of the overall partitioned loop antenna), which is in turn coupled to another portion or part of the loop antenna (labeled as 310) which is also external to module 80.

Although various embodiments are described with respect to loop antennas, other types of antenna may be used, as persons of ordinary skill in the art will understand. The choice of antenna depends on various factors, such design specifications, performance specifications, cost, substrate characteristics and dimensions, module (if used) characteristics and dimensions, available technology, target markets, target end-users, etc., as persons of ordinary skill in the art will understand.

Figure 33:
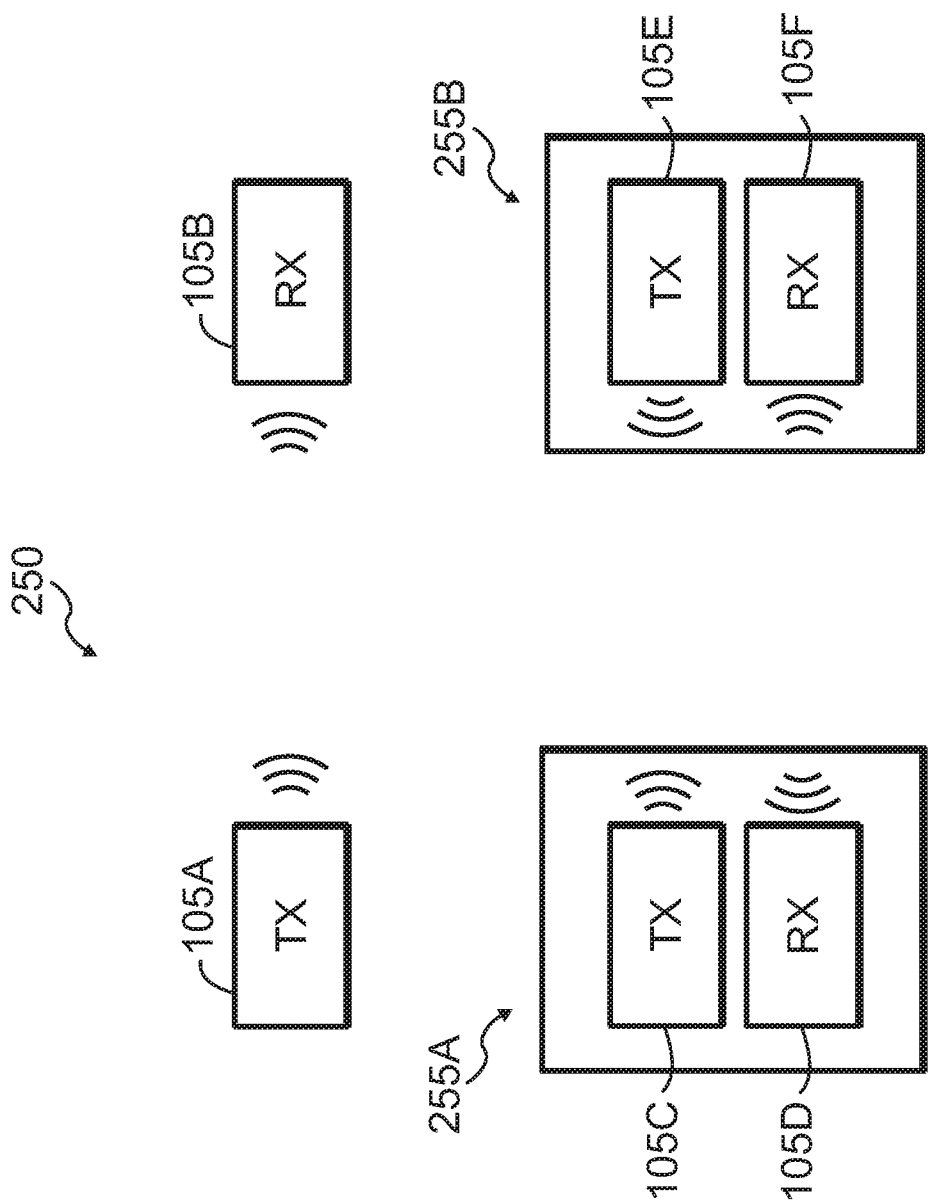
FIG. 33 shows a system for radio communication according to an exemplary embodiment.

Antenna structures or loop antennas (which include a looped conductor and a substrate edge) and RF circuits according to exemplary embodiments may be used in a variety of communication arrangements, systems, sub-systems, networks, etc., as desired. FIG. 33 shows a system 250 for radio communication according to an exemplary embodiment.

System 250 includes a transmitter 105A, which includes antenna structure 15 (not shown). Via antenna structure 15 or loop antenna 310, transmitter 105A transmits RF signals. The RF signals may be received by receiver 105B, which includes antenna structure 15 (not shown) or loop antenna 310 (not shown). In addition, or alternatively, transceiver 255A and/or transceiver 255B might receive the transmitted RF signals via receiver 105D and receiver 105F, respectively. One or more of receiver 105D and receiver 105F includes antenna structure 15 (not shown) or loop antenna 310 (not shown).

In addition to receive capability, transceiver 255A and transceiver 255B can also transmit RF signals. More specifically, transmitter 105C and/or transmitter 105E in transceiver 255A and transceiver 255B, respectively, may transmit RF signals. The transmitted RF signals might be received by receiver 105B (the stand-alone receiver), or via the receiver circuitry of the non-transmitting transceiver. One or more of transmitter 105C and transmitter 105E includes antenna structure 15 (not shown) or loop antenna 310 (not shown).

Other systems or sub-systems with varying configuration and/or capabilities are also contemplated. For example, in some exemplary embodiments, two or more transceivers (e.g., transceiver 255A and transceiver 255B) might form a network, such as an ad-hoc network. As another example, in some exemplary embodiments, transceiver 255A and transceiver 255B might form part of a network, for example, in conjunction with transmitter 105A.

In exemplary embodiments, RF apparatus including antenna structure 15 may include a variety of RF circuitry 35. For example, in some embodiments, direct conversion receiver and/or transmitter circuitry may be used. As another example, in some embodiments, low intermediate frequency (IF) receiver and offset phase locked loop (PLL) transmitter circuitry may be used.

In other embodiments, other types of RF receiver and/or transmitter may be used, as desired. The choice of circuitry for a given implementation depends on a variety of factors, as persons of ordinary skill in the art will understand. Such factors include design specifications, performance specifications, cost, IC, die, module, or device area, available technology, such as semiconductor fabrication technology), target markets, target end-users, etc.

In exemplary embodiments, RF apparatus including antenna structure 15 or loop antenna 310 may communicate according to or support a variety of RF communication protocols or standards. For example, in some embodiments, RF communication according to Wi-Fi protocols or standards may be used or supported. As another example, in some embodiments, RF communication according to Bluetooth protocols or standards may be used or supported. As another example, in some embodiments, RF communication according to ZigBee protocols or standards may be used or supported. Other protocols or standards are contemplated and may be used or supported in other embodiments, as desired.

In other embodiments, other types of RF communication according to other protocols or standards may be used or supported, as desired. The choice of protocol or standard for a given implementation depends on a variety of factors, as persons of ordinary skill in the art will understand. Such factors include design specifications, performance specifications, cost, complexity, features (security, throughput), industry support or availability, target markets, target end-users, target devices (e.g., IoT devices), etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
a module, comprising an impedance matching circuit;
a first capacitor external to the module and coupled to the impedance matching circuit; and
a loop antenna to transmit or receive the RF signals, wherein the loop antenna is coupled to the first capacitor,
wherein the first capacitor is coupled in series between the loop antenna and the impedance matching network.

2. The apparatus according to claim 1, wherein the RF circuit transmits or receives RF signals.

3. The apparatus according to claim 2, further comprising a second capacitor external to the module and coupled to the RF circuit and to the matching circuit.

4. The apparatus according to claim 1, wherein a capacitance value of the first capacitor is tuned depending on a loop size of the loop antenna.

5. The apparatus according to claim 1, wherein the impedance matching circuit comprises a resonant network coupled to a reactive network.

6. The apparatus according to claim 1, wherein the impedance matching circuit comprises a first reactive network coupled to a second reactive network.

7. The apparatus according to claim 1, wherein the loop antenna comprises a conductive loop of a substrate, and wherein the module and the first capacitor are attached to the substrate.

8. An apparatus, comprising:
a module, comprising:
a radio frequency (RF) circuit to transmit or receive RF signals; and
an impedance matching circuit;
a first capacitor external to the module and coupled to the impedance matching circuit;
a second capacitor external to the module, wherein the second capacitor is coupled to a the RF circuit; and
a loop antenna to transmit or receive the RF signals, wherein the loop antenna is coupled to the first capacitor,
wherein the first capacitor is coupled in series between the loop antenna and the impedance matching network.

9. The apparatus according to claim 8, wherein a capacitance value of the first capacitor is tuned depending on a loop size of the loop antenna.

10. The apparatus according to claim 8, wherein the loop antenna comprises a conductive loop of a substrate.

11. The apparatus according to claim 10, wherein the module, the first capacitor, and the second capacitor are attached to the substrate.

12. The apparatus according to claim 8, wherein impedance matching circuit comprises a resonant network coupled to a reactive network.

13. The apparatus according to claim 8, wherein the impedance matching circuit comprises a first reactive network coupled to a second reactive network.

14. A method of fabricating an apparatus, the method comprising:
fabricating a module comprising an impedance matching circuit;
fabricating a first capacitor external to the module and coupled to the impedance matching circuit; and
fabricating a loop antenna to transmit or receive the RF signals, wherein the loop antenna is coupled to the first capacitor,
wherein the first capacitor is coupled in series between the loop antenna and the impedance matching network.

15. The method according to claim 14, wherein fabricating the module comprises providing a radio frequency (RF) circuit to transmit or receive RF signals.

16. The method according to claim 15, further comprising fabricating second capacitor external to the module and coupled to the RF circuit and to the matching circuit.

17. The method according to claim 14, wherein a capacitance value of the first capacitor is tuned depending on a loop size of the loop antenna.

18. The method according to claim 14, wherein the impedance matching circuit comprises a resonant network coupled to a reactive network.

19. The method according to claim 14, wherein the impedance matching circuit comprises a first reactive network coupled to a second reactive network.

20. The method according to claim 14, wherein the loop antenna comprises a conductive loop of a substrate, and wherein the module and the first capacitor are attached to the substrate.

\* \* \* \* \*